(12) United States Patent
Nozawa et al.

(10) Patent No.: US 8,973,527 B2
(45) Date of Patent: Mar. 10, 2015

(54) PLASMA PROCESSING APPARATUS, PLASMA PROCESSING METHOD, METHOD FOR CLEANING PLASMA PROCESSING APPARATUS AND PRESSURE CONTROL VALVE FOR PLASMA PROCESSING APPARATUS

(75) Inventors: Toshihisa Nozawa, Sendai (JP); Shinji Komoto, Amagasaki (JP); Masahide Iwasaki, Sendai (JP)

(73) Assignee: Tokyo Electron Limited (JP)

( * ) Notice: Subject to any disclaimer, the term of this patent is extended or adjusted under 35 U.S.C. 154(b) by 902 days.

(21) Appl. No.: 13/061,356

(22) PCT Filed: Aug. 27, 2009

(86) PCT No.: PCT/JP2009/064965
§ 371 (c)(1),
(2), (4) Date: Apr. 1, 2011

(87) PCT Pub. No.: WO2010/024334
PCT Pub. Date: Mar. 4, 2010

(65) Prior Publication Data
US 2012/0111427 A1 May 10, 2012

(30) Foreign Application Priority Data

Aug. 28, 2008 (JP) .................................. 2008-219180
Jun. 29, 2009 (WO) .................. PCT/JP2009/061873

(51) Int. Cl.
*C23C 16/455* (2006.01)
*C23F 1/00* (2006.01)
(Continued)

(52) U.S. Cl.
CPC ....... *H01J 37/32449* (2013.01); *C23C 16/4412* (2013.01); *H01J 37/3244* (2013.01); *H01J 37/32834* (2013.01); *H01J 37/32862* (2013.01)
USPC ................................. 118/723 R; 156/345.29

(58) Field of Classification Search
USPC .................................. 118/723 R; 156/345.29
See application file for complete search history.

(56) References Cited

U.S. PATENT DOCUMENTS 5,242,539 A * 9/1993 Kumihashi et al. ............. 216/67
5,391,260 A * 2/1995 Makino et al. .................. 216/69
(Continued)

FOREIGN PATENT DOCUMENTS

JP 58098916 6/1983
JP 2002-231712 8/2002
(Continued)

OTHER PUBLICATIONS

International Search Report—PCT/JP2009/064965 dated Oct. 6, 2009.

*Primary Examiner* — Rudy Zervigon
(74) *Attorney, Agent, or Firm* — Cantor Colburn LLP

(57) ABSTRACT

A plasma processing apparatus is provided with a first exhaust path which extends downward from an exhaust hole; a second exhaust path which is connected to a downstream end portion of the first exhaust path in the exhausting direction and extends in a direction perpendicular to a direction in which the first exhaust path extends, and whose cross-section, which orthogonally intersects with the exhausting direction, is horizontally long such that a widthwise length is greater than a vertical length in the cross-section; a third exhaust path which is connected to a downstream end portion of the second exhaust path in the exhausting direction and extends in a direction perpendicular to the direction in which the second exhaust path extends; a pump which is connected to a downstream end portion of the third exhaust path in the exhausting direction and depressurizes an inside of a processing container; a pressure control valve which is provided in the second exhaust path, and comprises a pressure control valve plate which is capable of closing the second exhaust path and controls a pressure at upstream and downstream sides in the exhausting direction; and a shut-off valve which is provided in the third exhaust path and comprises a shut-off valve plate which opens and closes the third exhaust path.

5 Claims, 21 Drawing Sheets

(51) Int. Cl.
*H01L 21/306* (2006.01)
*C23C 16/52* (2006.01)
*H01J 37/32* (2006.01)
*C23C 16/44* (2006.01)
*C23C 16/06* (2006.01)
*C23C 16/22* (2006.01)

(56) References Cited

U.S. PATENT DOCUMENTS

| | | | | |
|---|---|---|---|---|
| 5,413,139 | A * | 5/1995 | Kusumoto et al. | 137/341 |
| 5,611,863 | A * | 3/1997 | Miyagi | 118/723 MP |
| 6,059,885 | A * | 5/2000 | Ohashi et al. | 118/730 |
| 7,052,576 | B2 * | 5/2006 | Park et al. | 156/345.24 |
| 7,273,526 | B2 * | 9/2007 | Shinriki et al. | 118/715 |
| 7,647,886 | B2 * | 1/2010 | Kubista et al. | 118/666 |
| 7,736,912 | B2 * | 6/2010 | Onishi | 438/5 |
| 7,927,066 | B2 * | 4/2011 | Moriya et al. | 415/90 |
| 8,142,567 | B2 * | 3/2012 | Kobayashi et al. | 118/715 |
| 8,236,105 | B2 * | 8/2012 | Bera et al. | 118/715 |
| 8,382,939 | B2 * | 2/2013 | Kutney et al. | 156/345.34 |
| 8,491,751 | B2 * | 7/2013 | Kobayashi et al. | 156/345.31 |
| 8,833,388 | B2 * | 9/2014 | Eto et al. | 137/487.5 |
| 2002/0000197 | A1 * | 1/2002 | Masuda et al. | 118/715 |
| 2003/0164225 | A1 * | 9/2003 | Sawayama et al. | 156/345.29 |
| 2006/0257243 | A1 * | 11/2006 | Moriya et al. | 415/90 |
| 2008/0050538 | A1 * | 2/2008 | Hirata | 427/585 |
| 2008/0067146 | A1 * | 3/2008 | Onishi et al. | 216/59 |
| 2009/0029487 | A1 * | 1/2009 | Onishi | 438/5 |
| 2010/0301011 | A1 * | 12/2010 | Sneh | 216/58 |
| 2011/0006038 | A1 * | 1/2011 | Kutney et al. | 216/58 |
| 2011/0146908 | A1 * | 6/2011 | Kobayashi et al. | 156/345.24 |
| 2011/0162678 | A1 * | 7/2011 | Moriya et al. | 134/21 |
| 2012/0111427 | A1 * | 5/2012 | Nozawa et al. | 137/511 |
| 2012/0292290 | A1 * | 11/2012 | Kaise et al. | 216/58 |
| 2014/0001154 | A1 * | 1/2014 | Sato et al. | 216/67 |

FOREIGN PATENT DOCUMENTS

| | | |
|---|---|---|
| JP | 2006-295099 | 10/2006 |
| KR | 20030030056 | 4/2003 |
| KR | 1020060024211 | 3/2006 |
| KR | 1020060119363 | 11/2006 |

* cited by examiner

PLASMA PROCESSING APPARATUS, PLASMA PROCESSING METHOD, METHOD FOR CLEANING PLASMA PROCESSING APPARATUS AND PRESSURE CONTROL VALVE FOR PLASMA PROCESSING APPARATUS

TECHNICAL FIELD

The present invention relates to a plasma processing apparatus, a plasma processing method, a method for cleaning the plasma processing apparatus, and a pressure control valve for plasma processing apparatus, and more particularly, to a plasma processing apparatus and a plasma processing method in which depressurization is performed during plasma processing, a method for cleaning the plasma processing apparatus, and a pressure control valve for plasma processing apparatus which is included in the plasma processing apparatus.

BACKGROUND ART

Semiconductor devices such as an LSI (Large Scale Integrated circuit) are manufactured by performing a plurality of processes, such as etching, CVD (Chemical Vapor Deposition), or sputtering, on a substrate to be processed which is a semiconductor substrate (wafer). These processes are performed by generating plasma in a processing container and supplying a reaction gas into the processing container, in a plasma processing apparatus.

When plasma processing is performed, a pressure in the processing container is sometimes decreased to a point where the processing container is in a high vacuum state, that is, an extremely low pressure state. Here, when the pressure in the processing container is decreased, a vacuum apparatus for performing depressurization by using an APC (Auto Pressure Controller) valve having a variable conductance function for controlling a pressure to a predetermined pressure which is disclosed in Japanese Laid-Open Patent Publication No. 2006-295099 (Patent Document 1) may be used.

[Patent Document 1] Japanese Laid-Open Patent Publication No. 2006-295099

DISCLOSURE OF THE INVENTION

Technical Problem

A general plasma processing apparatus is provided with a processing container in which a substrate to be processed is processed, and a holding stage on which the substrate to be processed is held. An exhaust hole for depressurization is opened in the processing container, and thus pressurization is performed by evacuating the processing container by using a pump from the exhaust hole through an exhaust path. Also, a pressure control valve for controlling a pressure at upstream and downstream sides in an exhausting direction or a shut-off valve for opening and closing the exhaust path is provided in the exhaust path.

Here, when the exhaust hole for depressurization is formed in the processing container, it is preferable that the exhaust hole is formed in a bottom portion of the processing container that is located under the holding stage in order to improve uniformity in processing the substrate to be processed. That is, the exhaust hole is formed under the holding stage, the exhaust path straightly extends from the exhaust hole to a position under the processing container, and the pump for depressurization is disposed at a lower end portion of the exhaust path.

However, in the plasma processing apparatus configured as described above, since the pressure control valve or the shut-off valve needs to be provided in the middle of the exhaust path in some cases, a vertical size is increased, thereby making the apparatus larger.

Here, there may be considered an attempt to make the apparatus smaller by reducing a vertical size by perpendicularly bending the exhaust path, which extends downward from the bottom portion of the processing container, and additionally perpendicularly bending the exhaust path to extend downward.

FIG. 23 is a schematic cross-sectional view showing main portions of a plasma processing apparatus in this case. Referring to FIG. 23, the plasma processing apparatus 101 includes a processing container 102 in which a substrate to be processed W is processed and a holding stage 103 on which the substrate to be processed W is held. An exhaust hole 104 is formed in a portion of the processing container 102 to open the portion of the processing container 102 thereby depressurizing the processing container 102. The exhaust hole 104 is formed in a bottom portion of the processing container 102 which is located under the holding stage 103.

An exhaust path 106 stretching from the exhaust hole 104 to a turbo molecular pump (hereinafter, referred to as TMP) 105 is provided in the plasma processing apparatus 101. The exhaust path 106 includes a first exhaust path 107 extending downward from the exhaust hole 104, a second exhaust path 108 formed to be bent perpendicularly from a downstream end portion of the first exhaust path 107 in an exhausting direction, and a third exhaust path 109 formed to be bent perpendicularly from a downstream end portion of the second exhaust path 108 in the exhausting direction. The exhaust path 106 is formed of a tubular exhaust pipe or the like.

By using this configuration, a vertical size of the plasma processing apparatus 101 can be reduced. Also, a dry pump 110 and an exhaust path 111 communicating with the dry pump 110 are provided as a preliminary high pressure exhaust line, indicated by an arrow $Z_1$ of FIG. 23, in the plasma processing apparatus 101. Also, a low pressure vacuum exhaust line using the TMP 105 is indicated by an arrow $Z_2$ of FIG. 23.

Here, as shown in FIG. 23, in the plasma processing apparatus 101, in order to make the apparatus smaller, a valve 112, which includes both a pressure control valve and a shut-off valve and is movable in a direction indicated by an arrow $Z_3$, may be provided in the third exhaust path 109.

However, in this configuration, a pressure in the exhaust path 106 in an area stretching to the valve 112 becomes the same as a pressure in the processing container 102. Then, an inside of the exhaust path 106 stretching to the valve 112, specifically, a wall 113 constituting the exhaust path 106, is contaminated by deposition (reaction product) generated in the processing container 102. As a result, a frequency of cleaning in the exhaust path 106 is increased, thereby degrading maintenance.

Meanwhile, in order to avoid this problem, a conventional pressure control valve including a valve plate having a disk shape may be provided in the second exhaust path 108. Here, since a pressure is controlled by rotating the valve plate, and high conductance is necessary in order to appropriately control a pressure in a wide range from a high pressure to a low pressure, the valve plate having a large diameter is required. Then, not only a diameter of the second exhaust path 108 is increased and thus a vertical size of the apparatus is increased, but also the second exhaust path 108 whose length needs to be the same as or longer than a length of a diameter of a circle of the valve plate is increased, thereby making the apparatus larger. In this case, even when such a pendulum-type valve as shown in Patent Document 1 is used instead of a rotating valve, it is difficult to control a pressure due to pendulum deformation or vibration.

An objective of the present invention is to provide a plasma processing apparatus which can improve maintenance and can get smaller.

Technical Solution

According to an embodiment of the present invention, there is provided a plasma processing apparatus for performing plasma processing on a substrate to be processed, the plasma processing apparatus including: a holding stage on which the substrate to be processed is held; a processing container which has an exhaust hole for depressurization under the holding stage and accommodates the holding stage; a first exhaust path which extends downward from the exhaust hole; a second exhaust path which is connected to a downstream side of the first exhaust path in an exhausting direction and extends in a direction different from a direction in which the first exhaust path extends, and whose cross-section, which orthogonally intersects with the exhausting direction, is horizontally long such that a widthwise length is greater than a vertical length in the cross-section; a third exhaust path which is connected to a downstream side of the second exhaust path in the exhausting direction and extends in a direction different from the direction in which the second exhaust path extends; a pump which is connected to a downstream side of the third exhaust path in the exhausting direction and depressurizes an inside of the processing container; a pressure control valve which is provided in the second exhaust path, and includes a pressure control valve plate which is capable of closing the second exhaust path and controls a pressure at upstream and downstream sides in the exhausting direction; and a shut-off valve which is provided in the third exhaust path and includes a shut-off valve plate which opens and closes the third exhaust path.

In this structure, since the first, second, and third exhaust paths are provided in different directions and the second exhaust path has a horizontally long cross-section orthogonally intersecting with the exhausting direction such that a widthwise length is greater than a vertical length in the cross-section, a vertical length can be reduced, thereby making the apparatus smaller. In this case, due to the pressure control valve plate capable of closing the second exhaust path, the conductance of the pressure control valve can be increased and pressure control can be achieved in a wide range from a high pressure to a lower pressure. Also, since the pressure control valve and the shut-off valve are separately provided and the pressure control valve is provided in the second exhaust path, contamination due to deposition in the exhaust path at a downstream side of the pressure control valve can be reduced. Accordingly, maintenance can be improved and the apparatus can get smaller.

Preferably, a cross-section of the second exhaust path may have a rectangular shape, with the cross-section orthogonally intersecting with the exhausting direction and a contour shape of the pressure control valve plate may be a rectangular shape capable of closing the second exhaust path.

More preferably, the pressure control valve plate may rotate about a shaft extending in a longer direction of the pressure control valve plate. In this structure, even though the amount of rotation of the pressure control valve plate is small, a pressure can be appropriately controlled.

More preferably, the shut-off valve may include an annular seal member located between the shut-off valve plate and a wall constituting the third exhaust path, and a protective member which protects the seal member may be provided outside the seal member. In this structure, due to the protective member, the attack of radicals generated in the processing container on the seal member can be reduced.

More preferably, the pump may include a high pressure pump which performs depressurization to a predetermined pressure and a low pressure pump which performs further depressurization after the depressurization by using the high pressure pump. The third exhaust path may include a high pressure exhaust path stretching from the second exhaust path to the high pressure pump, and a low pressure exhaust path stretching from the second exhaust path to the low pressure pump. The shut-off valve may include a high pressure shut-off valve provided in the high pressure exhaust path, and a low pressure shut-off valve provided in the low pressure exhaust path. An accommodating portion, which outwardly protrudes and accommodates the low pressure shut-off valve in an inner space of the accommodating portion, is formed at the low pressure exhaust path, and the accommodating portion constitutes a part of the high pressure exhaust path.

More preferably, the plasma processing apparatus may further include a microwave generator which generates a microwave for exciting plasma, and a dielectric plate which is provided to face the holding stage and introduces a microwave into the processing container.

More preferably, the pump may include a turbo molecular pump.

According to another embodiment of the present invention, there is provided a method for cleaning a plasma processing apparatus for performing plasma processing on a substrate to be processed, the plasma processing apparatus including: a holding stage on which the substrate to be processed is held; a processing container which has an exhaust hole for depressurization under the holding stage and accommodates the holding stage; a first exhaust path which extends downward from the exhaust hole; a second exhaust path which is connected to a downstream side of the first exhaust path in an exhausting direction and extends in a direction different from a direction in which the first exhaust path extends, and whose cross-section, which orthogonally intersects with the exhausting direction, is horizontally long such that a widthwise length is greater than a vertical length in the cross-section; a third exhaust path which is connected to a downstream side of the second exhaust path in the exhausting direction and extends in a direction different from the direction in which the second exhaust path extends; a pump which is connected to a downstream side of the third exhaust path in the exhausting direction and depressurizes an inside of the processing container; a pressure control valve which is provided in the second exhaust path, and includes a pressure control valve plate which is capable of closing the second exhaust path and controls a pressure at upstream and downstream sides in the exhausting direction; and a shut-off valve which is provided in the third exhaust path and includes a shut-off valve plate which opens and closes the third exhaust path, wherein the method includes: controlling a pressure in the plasma processing apparatus to a first pressure by using the pressure control valve; after the controlling of the pressure to the first pressure, first cleaning of cleaning the inside of the plasma processing apparatus by introducing a cleaning gas into the plasma processing apparatus; after the first cleaning, controlling the pressure in the plasma processing apparatus to a second pressure, which is higher than the first pressure, by using the pressure control valve; and after the controlling of the pressure to the second pressure, second cleaning of cleaning the inside of the plasma processing apparatus by introducing a cleaning gas into the plasma processing apparatus.

In this structure, in the plasma processing apparatus configured as described above, deposition attached to the wall of the exhaust path or the processing container can be actively removed by controlling a pressure in the plasma processing apparatus to a first pressure that is relatively low and increasing energy of an introduced cleaning gas. Also, after the deposition is actively removed in a low pressure state, deposition attached to the wall of the exhaust path or the processing container can be removed without damaging the wall by controlling the pressure to a second pressure that is relatively high, and reducing energy of an introduced cleaning gas. In this case, due to the pressure control valve configured as described above, an inside of the plasma processing apparatus can be easily controlled from a low pressure state of the first pressure to a high pressure state of the second pressure while using the same exhaust line, that is, without switching between a high pressure exhaust line and a low pressure exhaust line. Accordingly, since low pressure and high pressure cleaning processes are performed in the exhaust line where plasma processing is also performed, deposition can be efficiently removed, thereby reducing an entire cleaning time.

According to another embodiment of the present invention, there is provided a plasma processing apparatus for performing plasma processing on a substrate to be processed, the plasma processing apparatus including: a holding stage on which the substrate to be processed is held; a processing container which has an exhaust hole for depressurization under the holding stage and accommodates the holding stage; a gas supply unit which supplies a gas into the processing container; a first exhaust path which extends downward from the exhaust hole; a second exhaust path which is connected to a downstream side of the first exhaust path in an exhausting direction and extends in a direction different from a direction in which the first exhaust path extends, and whose cross-section, which orthogonally intersects with the exhausting direction, is horizontally long such that a widthwise length is greater than a vertical length in the cross-section; a third exhaust path which is connected to a downstream side of the second exhaust path in the exhausting direction and extends in a direction different from the direction in which the second exhaust path extends; a pump which is connected to a downstream side of the third exhaust path in the exhausting direction and depressurizes an inside of the processing container; a pressure control valve which is provided in the second exhaust path, and includes a pressure control valve plate which is rotatable about a shaft extending in a longer direction of the pressure control valve plate, is capable of closing the second exhaust path and controls a pressure at upstream and downstream sides in the exhausting direction; a shut-off valve which is provided in the third exhaust path and includes a shut-off valve plate which opens and closes the third exhaust path; and a pressure changing unit which changes a pressure in the processing container from a first pressure to a second pressure that is different from the first pressure.

Preferably, the pressure changing unit may control the pressure in the processing container based on at least one parameter selected from a group consisting of a flow rate of the gas supplied by the gas supply unit, a type of the gas supplied by the gas supply unit, a condition under which plasma is formed in the processing container, and a density of plasma formed in the processing container.

More preferably, the pressure changing unit may include a memory unit which stores data of an opening degree of the pressure control valve plate corresponding to the second pressure and the at least one parameter selected from a group consisting of a flow rate of the gas supplied by the gas supply unit, a type of the gas supplied by the gas supply unit, a condition under which plasma is formed in the processing container and a density of plasma formed in the processing container, with the data being related to the at least one parameter and the data.

Also, the gas supply unit may include a gas supply path through which a gas is supplied into the processing container and a gas supply valve capable of opening and closing the gas supply path, wherein when a pressure in the processing container is changed from the first pressure to the second pressure that is higher than the first pressure, the pressure changing unit supplies the gas into the gas supply path while the gas supply valve is closed, and after a predetermined period of time elapses from the supplying of the gas into the gas supply path, opens the gas supply valve to supply the gas into the processing container.

According to another embodiment of the present invention, there is provided a plasma processing method performed in a plasma processing apparatus including: a holding stage on which a substrate to be processed is held; a processing container which has an exhaust hole for depressurization under the holding stage and accommodates the holding stage; a gas supply unit which includes a gas supply path for supplying a gas into the processing container and a gas supply valve capable of closing the gas supply path and which supplies a gas into the processing container; a first exhaust path which extends downward from the exhaust hole; a second exhaust path which is connected to a downstream side of the first exhaust path in an exhausting direction and extends in a direction different from a direction in which the first exhaust path extends, and whose cross-section, which orthogonally intersects with the exhausting direction, is horizontally long such that a widthwise length is greater than a vertical length in the cross-section; a third exhaust path which is connected to a downstream side of the second exhaust path in the exhausting direction and extends in a direction different from the direction in which the second exhaust path extends; a pump which is connected to a downstream side of the third exhaust path in the exhausting direction and depressurizes an inside of the processing container; a pressure control valve which is provided in the second exhaust path, and includes a pressure control valve plate which is rotatable about a shaft extending in a longer direction of the pressure control valve plate, is capable of closing the second exhaust path and controls a pressure at upstream and downstream sides in the exhausting direction; a shut-off valve which is provided in the third exhaust path and includes a shut-off valve plate which opens and closes the third exhaust path; and a pressure changing unit which changes a pressure in the processing container from a first pressure to a second pressure that is different from the first pressure, the plasma processing method including: when the pressure in the processing container is changed from the first pressure to the second pressure, supplying a gas into the gas supply path while the gas supply valve is closed; and after a predetermined period of time elapses from the supplying of the gas, opening the gas supply valve to supply a gas into the processing container thereby controlling the pressure in the processing container to the second pressure.

According to another embodiment of the present invention, a pressure control valve for plasma processing apparatus which is included in a plasma processing apparatus for performing plasma processing on a substrate to be processed, the plasma processing apparatus including: a holding stage on which the substrate to be processed is held; a processing container which has an exhaust hole for depressurization under the holding stage and accommodates the holding stage; an exhaust path which has a portion extending downward from the exhaust hole and whose cross-section, which orthogonally intersects with an exhausting direction, has a portion of a longer direction and a portion of a shorter direction in at least a part of the exhaust path, with the longer direction orthogonally intersecting with the shorter direction; a pump which is connected to a downstream side of the exhaust path in an exhausting direction and depressurizes an inside of the processing container; and a shut-off valve which opens and closes the exhaust path, wherein the pressure control valve: is provided in the exhaust path of an upstream side of the shut-off valve in the exhausting direction, includes a pressure control valve plate which has a portion of a longer direction and a portion of a short direction, with the longer direction of the pressure control valve plate orthogonally intersecting with the shorter direction of the pressure control valve plate, and is attached to the part of the exhaust path and controls a pressure at upstream and downstream sides of the pressure control valve for plasma processing apparatus in the exhausting direction.

As such, when the pressure in the processing container is changed from a first pressure to a second pressure, the pressure can be efficiently changed, thereby changing the pressure to a desired pressure in a shorter time. Accordingly, throughput can be improved and film quality of the substrate to be processed in plasma processing can be improved.

Preferably, the exhaust path may include: a first exhaust path which extends downward from the exhaust hole; a second exhaust path which is connected to a downstream side of the first exhaust path in the exhausting direction and extends in a direction different from in a direction in which the first exhaust path extends, and whose cross-section, which orthogonally intersects with the exhausting direction, is horizontally long such that a widthwise length is greater than a vertical length in the cross-section; and a third exhaust path which is connected to a downstream side of the second exhaust path in the exhausting direction and extends in a direction different from the direction in which the second exhaust path extends. The pressure control valve for plasma processing apparatus may be provided in the second exhaust path.

More preferably, the shut-off valve may be provided in the third exhaust path.

More preferably, the cross-section of the second exhaust path may have a rectangular shape, with the cross-section orthogonally intersecting with the exhausting direction, and a contour shape of the pressure control valve plate may be a rectangular shape capable of closing the second exhaust path.

More preferably, the pressure control valve plate may rotate about a shaft extending in the longer direction of the pressure control valve plate.

More preferably, the pressure control valve plate may have a both-side holding structure.

More preferably, the pressure control valve for plasma processing apparatus may be detachably provided in the exhaust path.

Advantageous Effects

According to such a plasma processing apparatus, since first, second, and third exhaust paths are provided in different directions and the second exhaust path has a horizontally long cross-section orthogonally intersecting with the exhausting direction such that a widthwise length is greater than a vertical length in the cross-section, a vertical length is reduced, thereby making the apparatus smaller. In this case, due to a pressure control valve plate capable of shutting the second exhaust path, the conductance of a pressure control valve can be increased and pressure control can be achieved in a wide range from a high pressure to a lower pressure. Also, since the pressure control valve and a shut-off valve are separately provided and the pressure control valve is provided in the second exhaust path, contamination due to deposition in the exhaust path at a downstream side of the pressure control valve can be reduced. Accordingly, maintenance can be improved and the apparatus can get smaller.

Also, according to a method for cleaning the plasma processing apparatus, in the plasma processing apparatus configured as described above, deposition attached to a wall of the exhaust path or the processing container can be removed actively by controlling a pressure in the plasma processing apparatus to a first pressure that is relatively low and increasing energy of an introduced cleaning gas. Also, after the deposition is removed actively in a low pressure state, deposition attached to the wall of the exhaust path or the processing container can be removed without damaging the wall by controlling a pressure to a second pressure that is relatively high and reducing energy of the introduced cleaning gas. In this case, by using the pressure control valve configured as described above, an inside of the plasma processing apparatus can be easily controlled from a low pressure state of the first pressure to a high pressure state of the second pressure while using the same exhaust line, that is, without switching between a high pressure exhaust line and a low pressure exhaust line. Accordingly, since low pressure and high pressure cleaning processes are performed in the exhaust line where plasma processing is also performed, deposition can be efficiently removed, thereby reducing an entire cleaning time.

Also, according to such a plasma processing apparatus and such a plasma processing method, when a pressure in the processing container is changed from a first pressure to a second pressure, the pressure can be efficiently changed to a desired pressure in a shorter time. Accordingly, throughput can be improved, and film quality of the substrate to be processed in plasma processing can be improved.

Also, according to such a pressure control valve for plasma processing apparatus, when a pressure in the processing container is changed from a first pressure to a second pressure, the pressure can be efficiently changed to a desired pressure in a shorter time. Accordingly, throughput can be improved, and film quality of the substrate to be processed in plasma processing can be improved.

BEST MODE FOR CARRYING OUT THE INVENTION

Hereinafter, the present invention will be described in detail by explaining exemplary embodiments of the invention with reference to the attached drawings.

Figure 1:
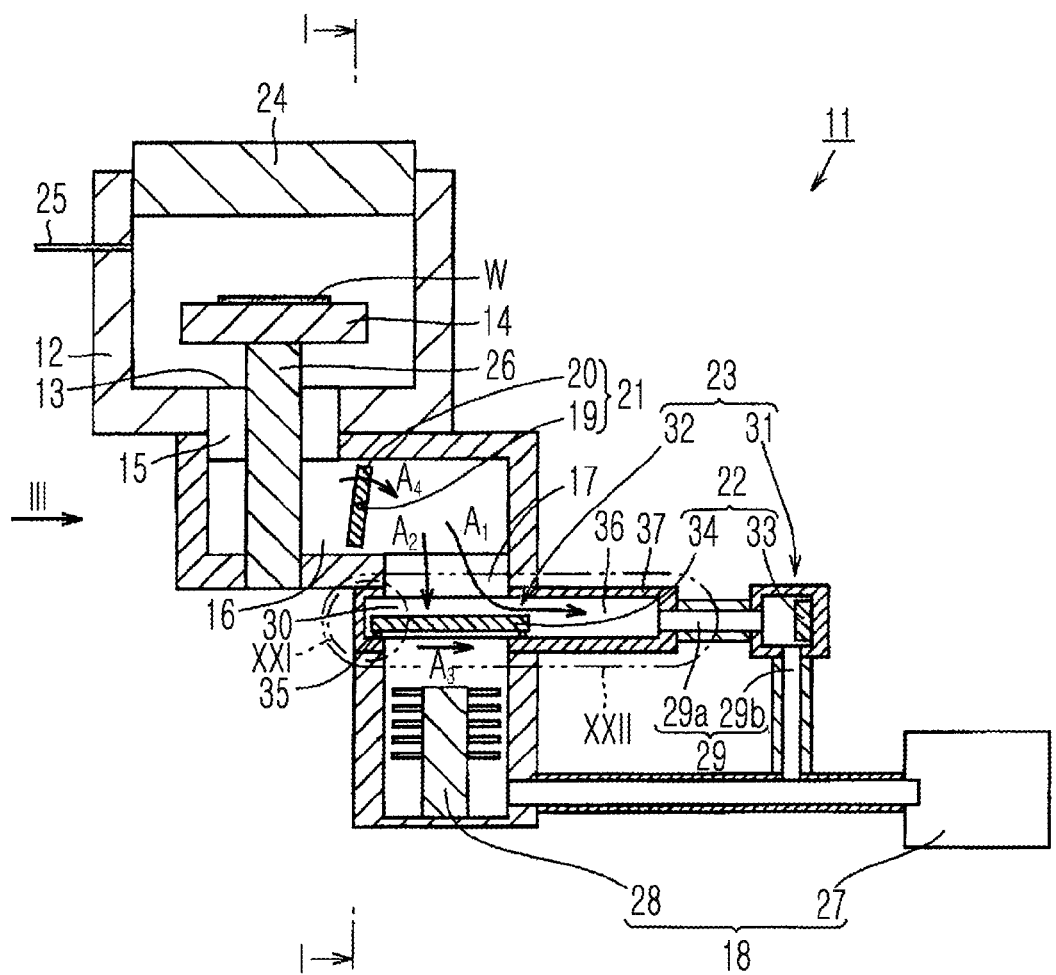
FIG. 1 is a schematic cross-sectional view showing main portions of a plasma processing apparatus according to an embodiment of the present invention, when depressurization is performed by using a dry pump.
Figure 2:
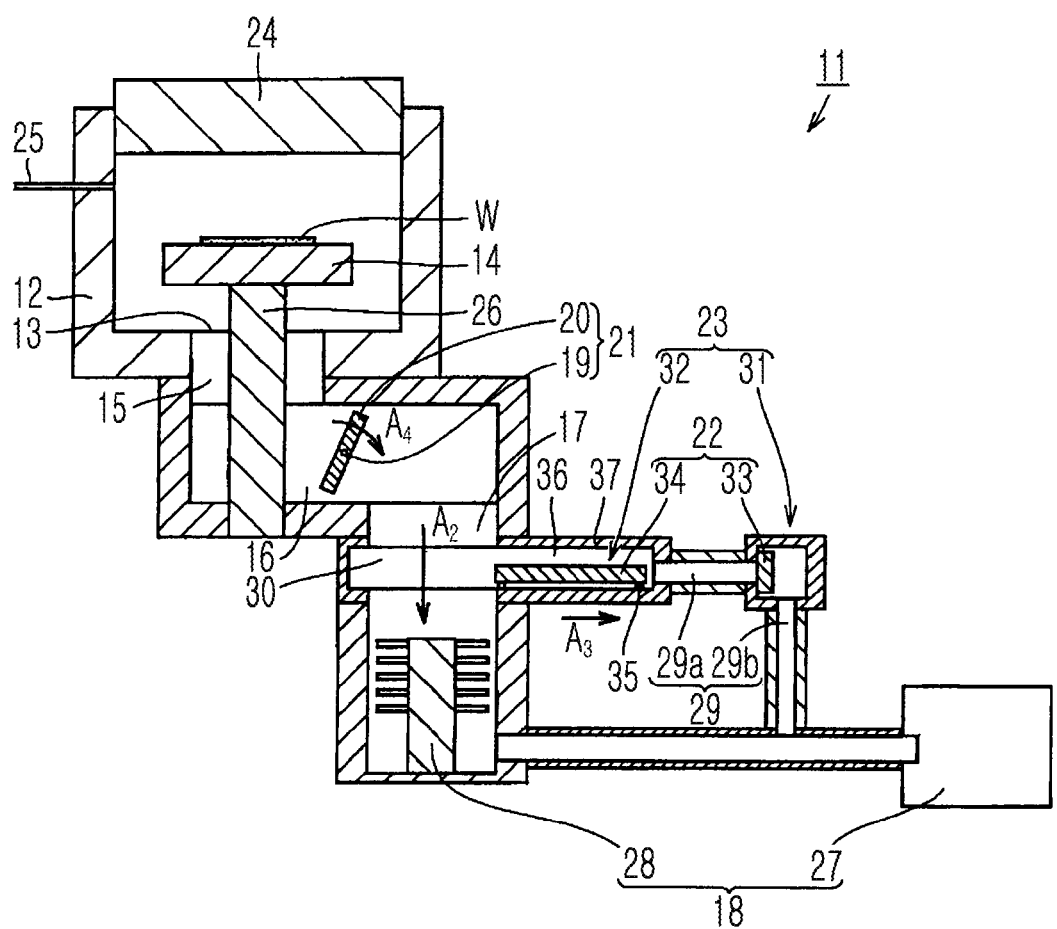
FIG. 2 is a view showing the plasma processing apparatus of FIG. 1, when depressurization is performed by using a TMP.

FIGS. 1 and 2 are schematic cross-sectional views showing main portions of a plasma processing apparatus 11 according to an embodiment of the present invention. FIG. 1 shows a case where depressurization is performed by using a high pressure dry pump as will be described later, and FIG. 2 shows a case where depressurization is performed by using a low pressure TMP as will be described later.

Referring to FIGS. 1 and 2, the plasma processing apparatus 11 performs plasma processing on a substrate to be processed W. The plasma processing apparatus 11 includes a holding stage 14 on which the substrate to be processed W is held, and a processing container 12 which has an exhaust hole 13 for depressurization formed under the holding stage 14 and accommodates the holding stage 14.

Also, the plasma processing apparatus 11 includes a first exhaust path 15 which extends downward from the exhaust hole 13, a second exhaust path 16 which is connected to a downstream end portion of the first exhaust path 15 in an exhausting direction, extends in a direction perpendicular to a direction in which the first exhaust path 15 extends, and has a horizontally long cross-section orthogonally intersecting with the exhausting direction such that a widthwise length is greater than a vertical length in the cross-section, a third exhaust path 17 which is connected to a downstream end portion of the second exhaust path 16 in the exhausting direction and extends in a direction perpendicular to the direction in which the second exhaust path 16 extends, and a pump 18 which is connected to a downstream end portion of the third exhaust path 17 in the exhausting direction and depressurizes an inside of the processing container 12. The first exhaust path 15 and the third exhaust path 17 vertically extend in the same direction. Also, the cross-section of the second exhaust path 16 intersecting with the exhausting direction has a rectangular shape. Here, the term "cross-section" refers to a cross-section taken along line I-I of FIG. 1. Also, the pump 18 and others will be explained later in detail.

The plasma processing apparatus 11 includes a pressure control valve 21 which is provided in the second exhaust path 16, is capable of closing the second exhaust path 16, and includes a pressure control valve plate 20 for controlling a pressure at upstream and downstream sides in the exhausting direction, and a shut-off valve 23 which is provided in the third exhaust path 17 and includes a shut-off valve plate 22 for opening and closing the third exhaust path 17. A contour shape of the pressure control valve plate 20 is a rectangular shape capable for closing the second exhaust path 16. The pressure control valve plate 20 rotates about a shaft axis extending in a longer direction. By using this configuration, even though the amount of rotation of the pressure control valve plate 20 is small, a pressure can be appropriately controlled.

The plasma processing apparatus 11 includes a plasma generating unit 24 which acts as plasma generating means for generating plasma in the processing container 12, and a reaction gas supply unit 25 which supplies a reaction gas for plasma processing into the processing container 12. The plasma processing unit 24 includes a microwave generator which generates a microwave for exciting plasma, and a dielectric plate (not shown) which is provided to face the holding stage 14 and introduces the microwave into the processing container. Also, a support portion 26 for supporting the holding stage 14 extends upward from an inside of the first exhaust path 15, that is, extends into the inside of the processing container 12.

The pump 18 includes a dry pump 27 which acts as a high pressure pump for decreasing a pressure from an atmospheric pressure to a predetermined pressure, and a TMP 28 which acts as a low pressure pump for performing additional depressurization after the pressure is decreased by the dry pump 27. Also, the third exhaust path 17 includes an high pressure exhaust path 29 stretching from the second exhaust path 16 to the dry pump 27, and an low pressure exhaust path 30 stretching from the second exhaust path 16 to the TMP 28. When the pump 18 depressurizes the inside of the processing container 12, the pump 18 also depressurizes insides of the first through third exhaust paths 15 through 17. Also, the high pressure exhaust path 29 includes a high pressure exhaust path 29a which extends in the same direction as the direction in which the second exhaust path 16 extends, and a high pressure exhaust path 29b which extends in a direction different from the direction in which the second exhaust path 16 extends, specifically, in a direction perpendicular to the direction in which the second exhaust path 16 extends.

The shut-off valve 23 includes a high pressure shut-off valve 31 which is provided in the high pressure exhaust path 29, and a low pressure shut-off valve 32 which is provided in the low pressure exhaust path 30. Both the high pressure shut-off valve 31 and the low pressure shut-off valve 32 are provided at a downstream side of the pressure control valve 21. The high pressure shut-off valve 31 includes a high pressure shut-off valve plate 33 which opens and closes the high pressure exhaust path 29. The low pressure shut-off valve 32 includes a low pressure shut-off valve plate 34 which opens and closes the low pressure exhaust path 30, and an annular O-ring 35 which acts as a seal member located between the low pressure shut-off valve plate 34 and a wall constituting the low pressure exhaust path 30. For example, a fluoro rubber is used as the O-ring 35.

An accommodating portion 37 which outwardly protrudes and is capable of accommodating in an inner space 36 thereof the low pressure shut-off valve plate 34 is provided in the low pressure exhaust path 30. The accommodating portion 37 is shaped such that a part of the low pressure exhaust path 30 outwardly protrudes to receive the low pressure shut-off valve plate 34. Here, the accommodating portion 37 constitutes a part of the high pressure exhaust path 29. That is, the inner space 36 of the accommodating portion 37 becomes the part of the high pressure exhaust path 29. Also, an exhausting direction in the high pressure exhaust path 29 is indicated by an arrow $A_1$ of FIG. 1, and an exhausting direction in the low pressure exhaust path 30 is indicated by an arrow $A_2$ of FIG. 1.

The high pressure shut-off valve plate 33 is movable in a direction indicated by an arrow $A_3$ of FIG. 1 and in a direction opposite to the direction indicated by the arrow $A_3$ of FIG. 1. Due to the movement of the high pressure shut-off valve plate 33, the high pressure exhaust path 29 is opened or closed. In detail, the high pressure exhaust path 29 is opened by moving the high pressure shut-off valve plate 33 in the direction indicated by the arrow $A_3$, and the high pressure exhaust path 29 is closed by moving the high pressure shut-off valve plate 33 in the direction opposite to the direction indicated by the arrow $A_3$.

The low pressure shut-off valve plate 34 is moved in the direction indicated by the arrow $A_3$ of FIG. 1 and is accommodated in the accommodating portion 37. Meanwhile, the low pressure shut-off valve plate 34 is moved in the direction opposite to the direction indicated by the arrow $A_3$ of FIG. 1 to seal the TMP 28 side together with the O-ring 35.

Figure 3:
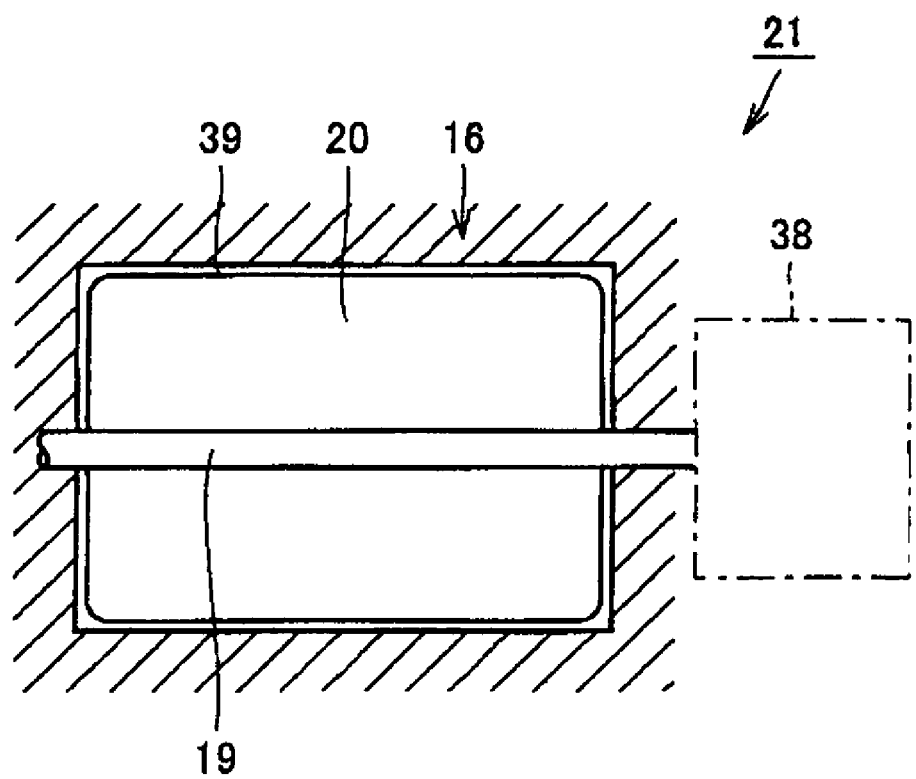
FIG. 3 is a view showing a pressure control valve included in the plasma processing apparatus of FIG. 1, seen from a direction indicated by an arrow III of FIG. 1.

Next, a detailed configuration of the pressure control valve 21 will be explained. FIG. 3 is a view showing the pressure control valve 21 provided in the second exhaust path 16, seen from a direction indicated by an arrow III of FIG. 1. Referring to FIGS. 1 through 3, the pressure control valve 21 includes the pressure control valve plate 20 which is disposed in the second exhaust path 16, a rotating shaft 19 which fixes the pressure control valve plate 20 and supports the pressure control valve plate 20, and a motor 38 which rotates the rotating shaft 19. The motor 38 is indicated by a one-dot-dashed line in FIG. 3.

The pressure control valve plate 20 is rotatable about the rotating shaft 19 due to a rotational force applied from the motor 38. In detail, the pressure control valve plate 20 rotates in a direction indicated by an arrow $A_4$ of FIG. 1 or in a direction opposite to the direction indicated by the arrow $A_4$ of FIG. 1. Due to the rotation of the pressure control valve plate 20, the amount of a gap 39 between a wall constituting the second exhaust path 16 and the pressure control valve plate 20 is changed. A pressure in the second exhaust path 16, specifically, a pressure at upstream and downstream sides of the pressure control valve 21, is controlled by controlling the amount of the gap 39. Also, the second exhaust path 16 can be closed by rotating the pressure control valve plate 20 to remove the gap 39.

The pressure control valve plate 20 has a so-called both-side holding structure. That is, one end side and another end side of the rotating shaft 19 are supported by the wall constituting the second exhaust path 16. By using this configuration, the pressure control valve plate 20 may endure a high pressure difference.

Also, a heater (not shown) may be provided in an inside of the pressure control valve plate 20 to heat the pressure control valve plate 20 to a predetermined temperature. Also, a heater may also be provided in an inside of the second exhaust path 16 at a position corresponding to a position of the pressure control valve plate 20 to heat the position of the pressure control valve plate 20 to a predetermined temperature. As such, since heat having been lost by a gas or the like passing through the second exhaust path 16 can be supplied, the amount of the gap 39 can be precisely controlled in consideration of thermal expansion or the like. That is, a gas flow rate can be precisely controlled. Also, due to the heating by the heater, deposition can be prevented from being attached to the pressure control valve plate 20 and the inside of the second exhaust path 16. Here, the heating by the heater is performed in a range of, for example, 80° C. to 200° C.

Also, according to the pressure control valve 21 configured as described above, since conductance is high, a range in which a pressure can be controlled can be increased. That is, a pressure can be controlled in a wide range from a high pressure to a low pressure by rotating the pressure control valve plate 20 having a rectangular shape. As such, a conventional structure including a high pressure control valve and a low pressure control valve can be realized with one pressure control valve configured as described above. While a conventional APC valve reaches an upper limit of pressure control with an opening degree of some extent, the pressure control valve of the present invention can achieve pressure control even with an opening degree of 6 or less, which is 3 to 4 times wider pressure control range than that of the conventional valve.

Also, the pressure control valve may be detachably provided to the plasma processing apparatus, specifically, the second exhaust path. As such, exchange or maintenance of the pressure control valve can be easily performed. The pressure control valve constitutes a part of the second exhaust path when being mounted in the second exhaust path.

That is, a pressure control valve for plasma processing apparatus according to the present invention is included in a plasma processing apparatus for performing plasma processing on a substrate to be processed, the plasma processing apparatus including: a holding stage on which the substrate to be processed is held; a processing container which has an exhaust hole for depressurization under the holding stage and accommodates the holding stage; a first exhaust path which extends downward from the exhaust hole; a second exhaust path which is connected to a downstream side of the first exhaust path in an exhausting direction and extends in a direction different from a direction in which the first exhaust path extends, and whose cross-section, which orthogonally intersects with the exhausting direction, is horizontally long such that a widthwise length is greater than a vertical length in the cross-section; a third exhaust path which is connected to a downstream side of the second exhaust path in the exhausting direction and extends in a direction different from the direction in which the second exhaust path extends; and a pump which is connected to a downstream side of the third exhaust path in the exhausting direction and depressurizes an inside of the processing container. The pressure control valve for plasma processing apparatus: is provided in the exhaust path of an upstream side of a shut-off valve in the exhausting direction; includes a pressure control valve plate having a horizontally long cross-section; and is capable of closing the exhaust path and controls a pressure at upstream and downstream sides of the pressure control valve for plasma processing apparatus in the exhausting direction.

Next, a method of depressurizing an inside of the processing container 12 by using the plasma processing apparatus 11 according to an embodiment of the present invention will be explained. First, a pressure at upstream and downstream sides of the pressure control valve 21 is controlled by rotating the pressure control valve plate 20 in the direction opposite to the direction indicated by the arrow $A_4$ of FIG. 1. In this case, since the conductance of the pressure control valve 21 is high, a pressure can be controlled with a small amount of rotation.

Then, depressurization is performed by using the high pressure exhaust path 29. In detail, while the low pressure exhaust path 30 is closed by moving the low pressure shut-off valve plate 34 in the direction opposite to the direction indicated by the arrow $A_3$, and the high pressure exhaust path 29 is opened by moving the high pressure shut-off valve plate 33 in the direction marked by the arrow $A_3$. Then, depressurization is performed by using the dry pump 27. In this case, a pressure is decreased from an atmospheric pressure to a pressure of about 1 Torr. As such, a so-called preliminary process is performed. In this case, the TMP 28 side is sealed by the O-ring 35.

After the pressure is decreased to about 1 Torr, the high pressure exhaust path 29 is replaced by the low pressure exhaust path 30. That is, while the high pressure exhaust path 29 is closed by moving the high pressure shut-off valve plate 33 in the direction opposite to the direction indicated by the arrow $A_3$, and the low pressure exhaust path 30 is opened by moving the low pressure shut-off valve plate 34 in the direction indicated by the arrow $A_3$. Next, additional depressurization is performed by using the TMP 28 by rotating the pressure control valve plate 20 in the direction indicated by the arrow $A_4$ while controlling a pressure at upstream and downstream sides of the pressure control valve 21.

As such, after the pressure is decreased until the inside of the processing container 12 is in a desired low pressure state, plasma processing is performed on the substrate to be processed W held by the holding stage 14.

According to the plasma processing apparatus 11, since the first, second, and third exhaust paths 15 through 17 are provided in different directions, and the second exhaust path 16 has a horizontally long cross-section orthogonally intersecting with the exhausting direction such that a widthwise length is greater than a vertical length in the cross-section, a vertical length of the second exhaust path 16 can be reduced, thereby making the apparatus smaller. In this case, due to the pressure control valve plate 20 capable of closing the second exhaust path 16, the conductance of the pressure control valve 21 can be increased and pressure control can be achieved in a wide range from a high pressure to a low pressure. Also, since the pressure control valve 21 and the shut-off valve 23 are separately provided and the pressure control valve 21 is provided in the second exhaust path 16, contamination due to deposition in the exhaust paths 16 and 17 at a downstream side of the pressure control valve 21 can be reduced. Accordingly, maintenance can be improved and the apparatus can get smaller.

In this case, since the shut-off valve 23 is provided at a more downstream side than the pressure control valve 21, a risk that radicals generated in the processing container 12 may reach around the shut-off valve 23 is reduced. Accordingly, the attack of the radicals on the O-ring 35 provided in the low pressure shut-off valve 32 can be reduced. Accordingly, a frequency of exchange of the O-ring 35 can be reduced, thereby further improving maintenance.

Also, when plasma processing is performed, that is, when exhaust is performed by the low pressure exhaust path 30, since the O-ring 35 of the low pressure shut-off valve 32 is accommodated in the accommodating portion 37, the attack of the radicals generated in the processing container 12 on the O-ring 35 can be reduced.

Also, the pressure control valve 21 including the pressure control valve plate 20 having a rectangular shape may be provided near the exhaust hole 13. Even in this regard, the plasma processing apparatus 11 can get smaller. That is, a size in a lateral direction of FIG. 1 can be reduced. Also, an area of an inside of the exhaust paths 16 and 17, which is capable of reducing contamination due to deposition, can be increased. Accordingly, maintenance can be improved. Also, the pressure control valve 21 may be exchangeably provided as a unit.

Figure 6:
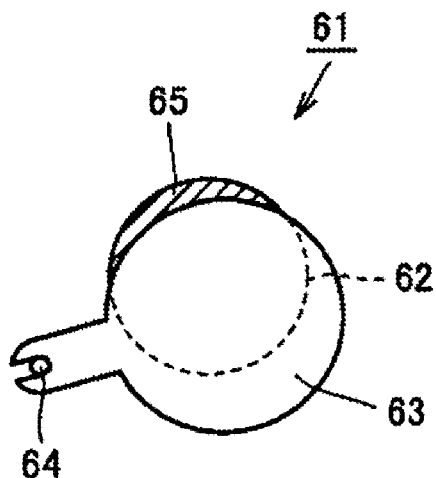
FIG. 6 is a view showing an opening area of the exhaust path in case using the pendulum-type valve included in the conventional plasma processing apparatus, when an opening degree of the valve plate is 20%.

Also, in the plasma processing apparatus 11 configured as described above, since the space 36 formed by the accommodating portion 37 constitutes a part of the high pressure exhaust path 29, the plasma processing apparatus 11 can get even smaller. Here, since the accommodating portion 37 is not a closed space as shown in FIG. 6, gas can smoothly circulate thereby removing deposition in a short time by dry cleaning. In this case, while depressurization is performed by using the high pressure exhaust path 29, dry cleaning can also be performed. Accordingly, maintenance can be improved.

Also, although a pressure is decreased to about 1 Torr by using the dry pump and then decreased by using the TMP in the above embodiment, the present invention is not limited thereto and an embodiment as shown below can be made. That is, after a pressure is decreased to 1 to 10 Torr by using a preliminary line, the pressure may be decreased by using the TMP. In this case, pressure control can be achieved in a range from a high pressure to a low pressure when the TMP is a drag type. As such, by using a preliminary line is used when starting the apparatus, a subsequent process can be performed by using one exhaust line in a range from a high pressure to a low pressure. In this case, since pressure control can be performed in a wide range from a high pressure to a low pressure by using the pressure control valve provided in the second exhaust path, depressurization, which is performed by switching between separate exhaust lines in the conventional art, can be performed while using the same exhaust line. Accordingly, time can be reduced, and depressurization can be efficiently performed.

Here, relationships between an opening area and an opening degree of a valve plate in a pendulum-type valve included in a conventional plasma processing apparatus and a pressure control valve included in a plasma processing apparatus according to the present invention will be explained.

Figure 4:
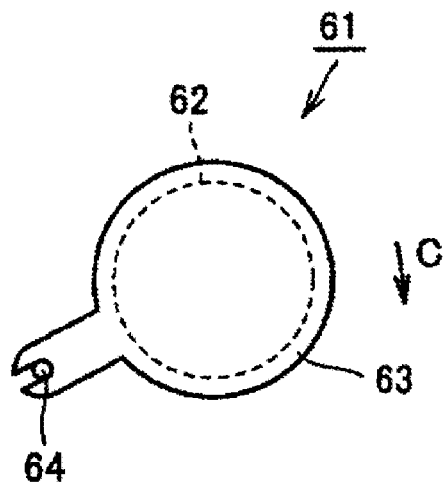
FIG. 4 is a view showing an opening area of an exhaust path in case using a pendulum-type valve included in a conventional plasma processing apparatus, when an opening degree of a valve plate is 0%.
Figure 5:
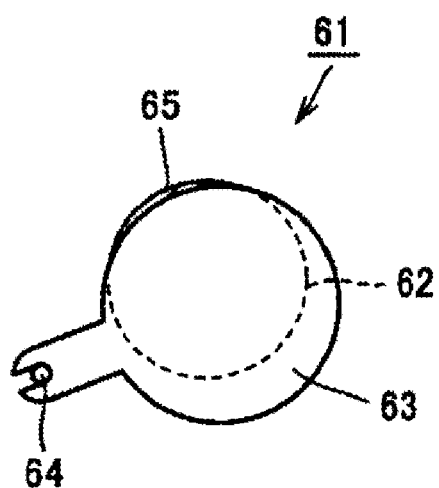
FIG. 5 is a view showing an opening area of the exhaust path in case using the pendulum-type valve included in the conventional plasma processing apparatus, when an opening degree of the valve plate is 10%.
Figure 7:
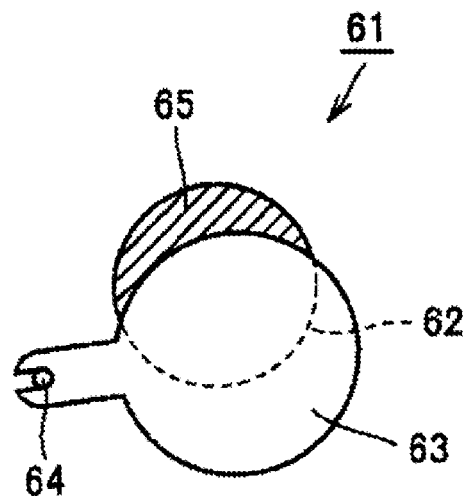
FIG. 7 is a view showing an opening area of the exhaust path in case using the pendulum-type valve included in the conventional plasma processing apparatus, when an opening degree of the valve plate is 30%.

FIGS. 4, 5, 6, and 7 are views showing an opening area of an exhaust path in the pendulum-type valve included in the conventional plasma processing apparatus. FIG. 4 shows a case where an opening degree of the valve plate is 0%, FIG. 5 shows a case where an opening degree of the valve plate is 10%, FIG. 6 shows a case where an opening degree of the valve plate is 20%, and FIG. 7 shows a case where an opening degree of the valve plate is 30%.

Referring to FIGS. 4 through 7, a pendulum-type valve 61 includes a valve plate 63 which includes a protruding portion outwardly protruding, and has a flat disk shape capable of covering an entire exhaust path 62. The valve plate 63 is rotatable in a direction indicated by an arrow C in FIG. 4 or a direction opposite to the direction indicated by the arrow C in FIG. 4 about a point 64 positioned around a front end of the protruding portion. Here, an opening degree of the valve plate 63 refers to a ratio of an angle by which the valve plate 62 is rotated about the point 64 of FIG. 4 when the opening degree is 0% in a closed state where the opening area covering the entire exhaust path 62 and an the opening degree is 100% in a open state where the opening area completely not covering the exhaust path 62. FIGS. 4 through 7 are views seen from a so-called exhausting direction, wherein a portion covered by the valve plate 63 in the exhaust path 62 is indicated by a dotted line, and an opening area 65 of the exhaust path 62 is indicated as a hatched area.

Figure 8:
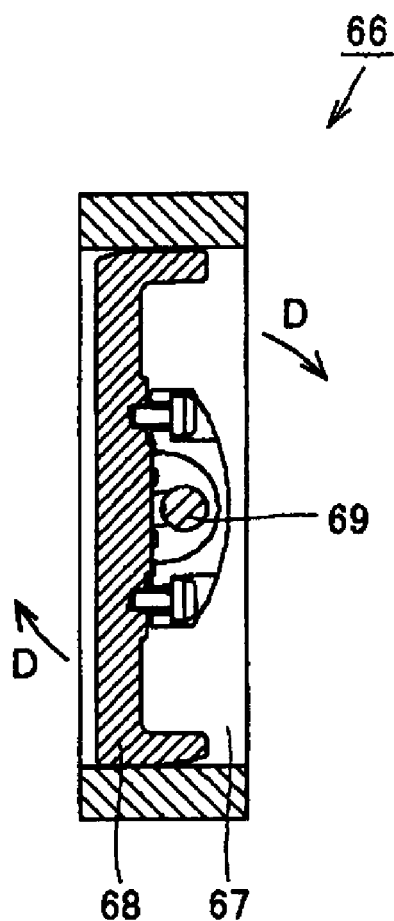
FIG. 8 is a view showing an opening area of an exhaust path in case using a pressure control valve included in a plasma processing apparatus according to the present invention, when an opening degree of a pressure control valve plate is 0%.
Figure 9:
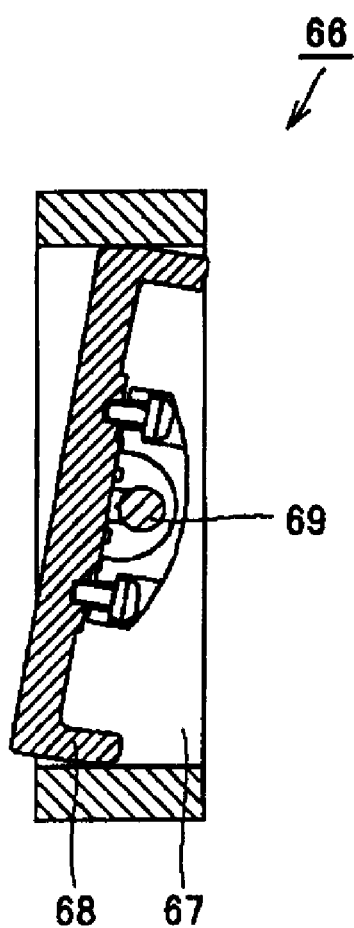
FIG. 9 is a view showing an opening area of the exhaust path in case using the pressure control valve included in the plasma processing apparatus according to the present invention, when an opening degree of the pressure control valve plate is 10%.
Figure 10:
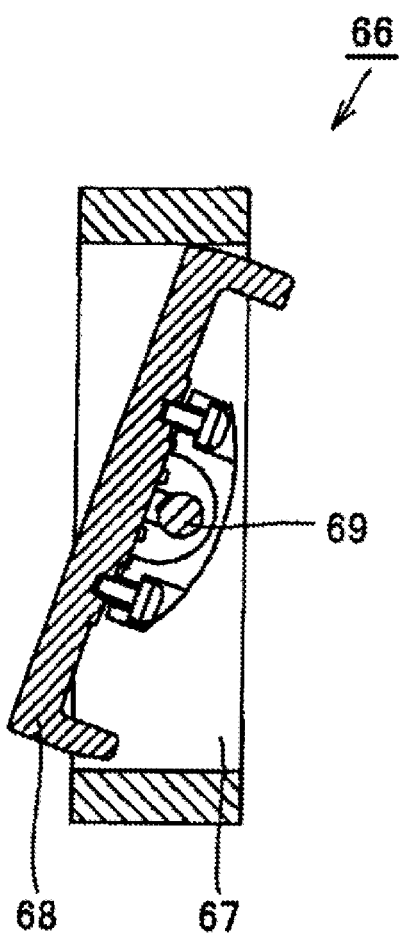
FIG. 10 is a view showing an opening area of the exhaust path in case using the pressure control valve included in the plasma processing apparatus according to the present invention, when an opening degree of the pressure control valve plate is 20%.
Figure 11:
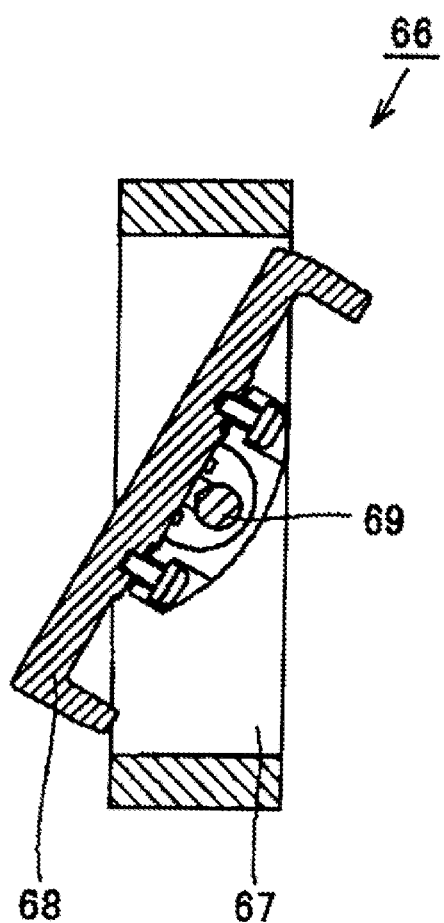
FIG. 11 is a view showing an opening area of the exhaust path in case using the pressure control valve included in the plasma processing apparatus according to the present invention, when an opening degree of the pressure control valve plate is 30%.

FIGS. 8, 9, 10, and 11 are views showing an opening area of an exhaust path in the pressure control valve included in the plasma processing apparatus according to the present invention. Also, each of cross-sectional views shown in FIGS. 8 through 11 corresponds to the cross-sectional view shown in FIG. 1. FIG. 8 shows a case where an opening degree of the pressure control valve plate is 0%, FIG. 9 shows a case where an opening degree of the pressure control valve is 10%, FIG. 10 shows a case where an opening degree of the pressure control valve is 20%, and FIG. 11 shows a case where an opening degree of the pressure control valve plate is 30%.

Referring to FIGS. 8 through 11, a pressure control valve 66 includes a pressure control valve plate 68 capable of controlling an opening area of an exhaust path 67. The pressure control valve plate 68 is rotatable in a direction indicated by an arrow D of FIG. 8 or a direction opposite to the direction indicated by the arrow D of FIG. 8 about a rotating shaft 69, as shown in FIG. 1 and the like. Here, an opening degree of the pressure control valve plate 68 refers to a ratio of an angle by which the pressure control valve plate 67 is rotated about the rotating shaft 69 of FIG. 8 when the opening degree is 0% in a state where the entire exhaust path 67 shown in FIG. 8 is covered, and the opening degree is 100% in a state where the pressure control valve plate 68 is rotated by 90° from an angle of the pressure control valve plate 68 shown in FIG. 8 about the rotating shaft 69 to be parallel to a direction in which the exhaust path 67 extends.

Figure 12:
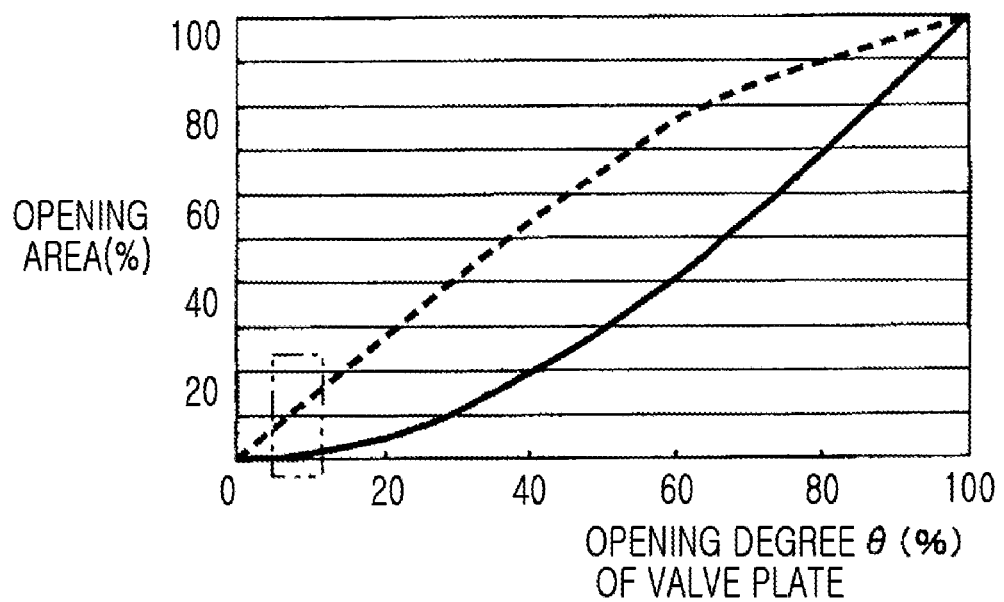
FIG. 12 is a graph showing relationships between an opening area of an exhaust path and an opening degree of a valve plate in cases using a pendulum-type valve included in a conventional plasma processing apparatus and a pressure control valve included in a plasma processing apparatus according to the present invention.

FIG. 12 is a graph showing relationships between an opening degree of a valve plate and an opening area of an exhaust path, in case using the pendulum-type valve included in the conventional plasma processing apparatus shown in FIGS. 4 through 7 and the pressure control valve included in the plasma processing apparatus according to the present invention shown in FIGS. 8 through 11. In FIG. 12, a dotted line indicates the pendulum-type valve included in the conventional plasma processing apparatus, and a solid line indicates the pressure control valve included in the plasma processing apparatus according to the present invention shown in FIG. 1.

Figure 13:
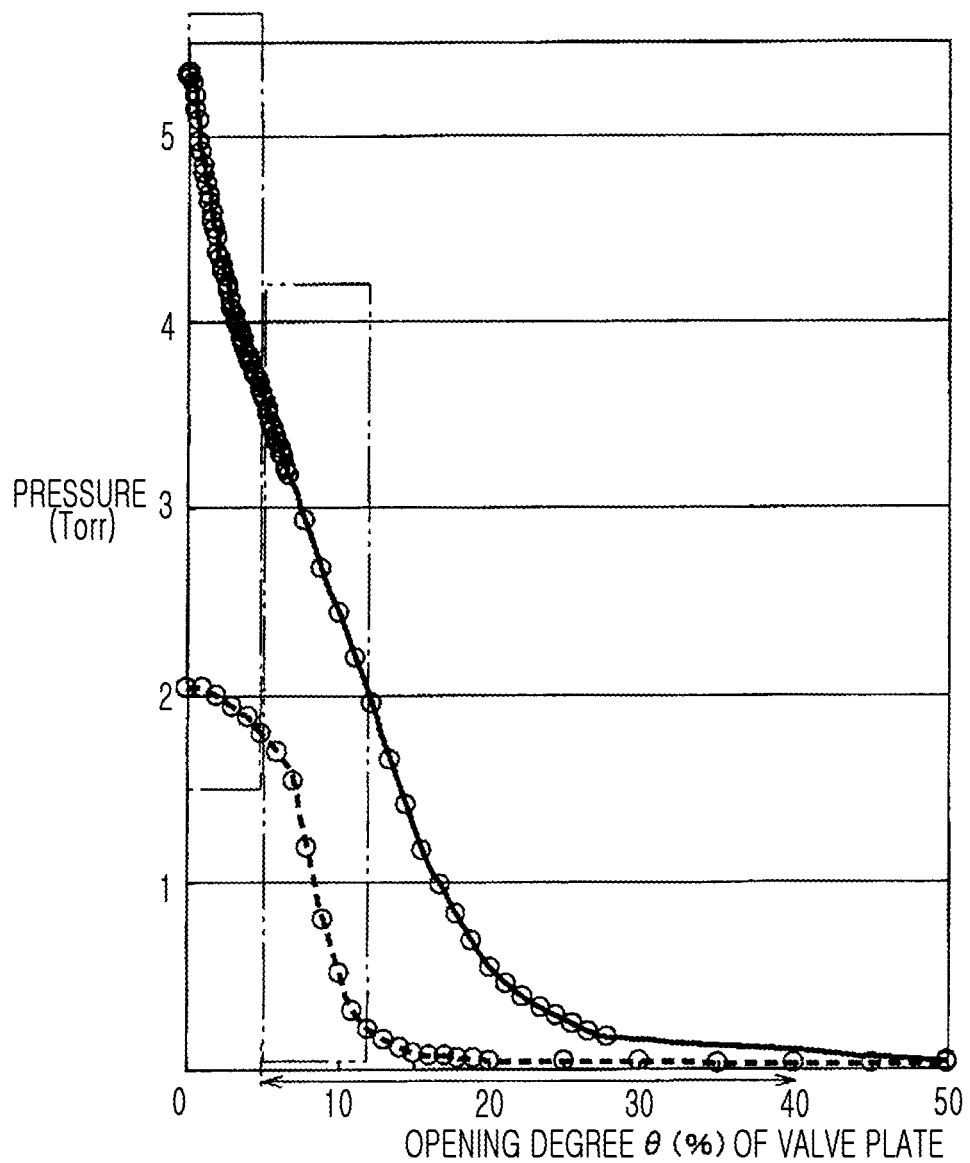
FIG. 13 is a graph showing relationships between an opening degree of a valve plate and a pressure in a processing container when a gas is supplied at a predetermined flow rate.

FIG. 13 is a graph showing relationships between an opening degree of a valve plate and a pressure in a processing container when a gas is supplied at a predetermined flow rate. In FIG. 13, a dotted line indicates the pendulum-type valve included in the conventional plasma processing apparatus, and a solid line indicates the pressure control valve included in the plasma processing apparatus according to the present invention shown in FIG. 1. Also, an area surrounded by a one-dot-dashed line in FIG. 13 is an area where a difference in controllability of conductance mainly occurs, and areas surrounded by two-dot-dashed lines in FIGS. 12 and 13 are areas where a difference in a rate of change of conductance manly occurs. FIG. 13 shows a case where an argon gas is supplied at a flow rate of 100 sccm. Also, FIG. 14 is a schematic cross-sectional view showing the conventional pendulum-type valve seen from a horizontal direction.

Figure 14:
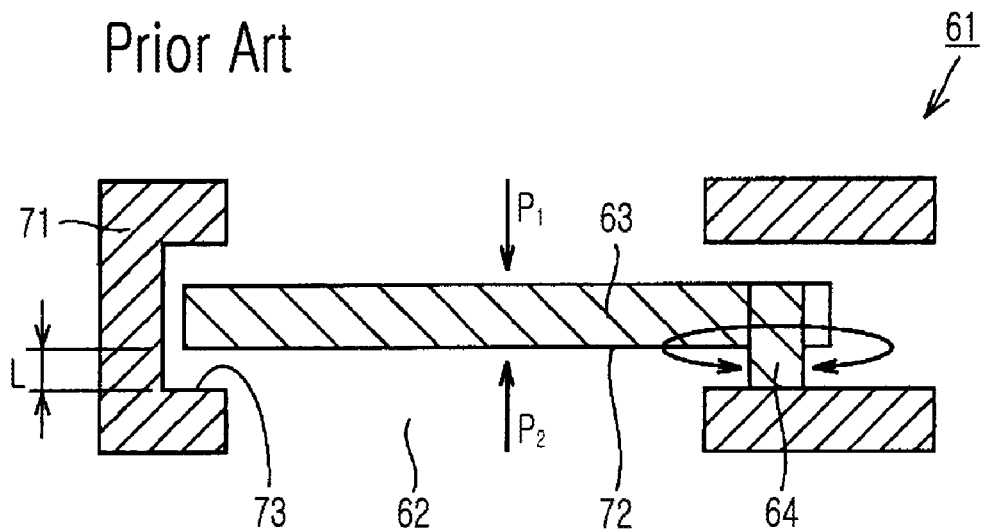
FIG. 14 is a schematic cross-sectional view showing the conventional pendulum-type valve shown in FIG. 4 and the like, seen from a horizontal direction.

Referring to FIGS. 12 through 14, in the conventional pendulum-type valve 61, as a distance from the point is increased, the support of the valve plate becomes insufficient. Thus, in order to allow deformation due to a pressure difference between a downward pressure $P_1$ in the valve 61 and an upward pressure $P_2$ in the valve 61 shown in FIG. 14, a predetermined clearance needs to be formed. The clearance is an interval, which is indicated by a length L of FIG. 14, between a bottom surface 72 of the valve plate 63 and a wall surface 73 of a part of a wall portion 71 constituting the exhaust path. Since such a clearance needs to be formed, there is a limitation on pressure control of the pendulum-type valve 61. A difference in controllability of conductance is shown in the area indicated by the one-dot-dashed line in FIG. 13 where pressure control cannot be achieved by the conventional pendulum-type valve 61 if a pressure difference is equal to or higher than 2 Torr. However, the pressure control valve according to the present invention has a high rigidity because of the both-side holding structure. As such, it is easy to manage a clearance, that is, the gap shown in FIG. 3. Accordingly, even when a pressure difference exceeds 5 Torr, the pressure control valve according to the present invention can achieve pressure control.

Also, as for an opening degree of a valve plate, a difference in a rate of change of conductance is clearly shown in the area indicated by the two-dot-dashed line of FIG. 13. That is, in the conventional pendulum-type valve, even though an opening degree of a valve plate is slightly changed, an opening area becomes increased. However, in the pressure control valve of the present invention, since a valve plate has a horizontally long shape, as described above, when an opening degree of a valve plate is slightly changed, an opening area is rarely increased. That is, a large difference in pressure control occurs due to a difference between rates of change of area caused by an opening degree of a valve plate.

Also, a plasma processing apparatus according to the present invention is a plasma processing apparatus for performing plasma processing on a substrate to be processed, and includes: a holding stage on the substrate to be processed is held; a processing container which has an exhaust hole for depressurization under the holding stage and accommodates the holding stage; a gas supply unit which supplies a gas into the processing container; a first exhaust path which extends downward from the exhaust hole; a second exhaust path which is connected to a downstream side of the first exhaust path in an exhausting direction and extends in a direction different from a direction in which the first exhaust path extends, and whose cross-section, which orthogonally intersects with the exhausting direction, is horizontally long such that a widthwise length is greater than a vertical length in the cross-section; a third exhaust path which is connected to a downstream side of the second exhaust path in the exhausting direction and extends in a direction different from the direction in which the second exhaust path extends; a pump which is connected to a downstream side of the third exhaust path in the exhausting direction and depressurizes an inside of the processing container; a pressure control valve which is provided in the second exhaust path, and includes a pressure control valve plate which is rotatable about a shaft extending in a longer direction of the pressure control valve plate, is capable of closing the second exhaust path and controls a pressure at upstream and downstream sides in the exhausting direction; a shut-off valve which is provided in the third exhaust path and includes a shut-off valve plate which opens and closes the third exhaust path; and a pressure changing unit which changes a pressure in the processing container from a first pressure to a second pressure that is different from the first pressure.

Here, the pressure changing unit controls the pressure in the processing container based on at least one parameter selected from a group consisting of a flow rate of the gas supplied by the gas supply unit, a type of the gas supplied by the gas supply unit, a plasma condition under which plasma is formed in the processing container and a density of plasma formed in the processing container. The term "plasma condition" may be, for example, power of a microwave, power of a bias or the like in microwave plasma.

Also, the pressure changing unit may be configured to include a memory unit which stores data of an opening degree of the pressure control valve plate corresponding to the second pressure, and the at least one parameter selected from a group consisting of a flow rate of the gas supplied by the gas supply unit, a type of the gas supplied by the gas supply unit, a plasma condition under which plasma is formed in the processing container and a density of plasma formed in the processing container, with the data of the opening degree being related to the at least one parameter.

According to the plasma processing apparatus, when a pressure in the processing container is changed from the first pressure to the second pressure, an effect of overshooting or undershooting while increasing and decreasing the pressure is reduced, thereby efficiently changing the pressure and obtaining a desired pressure in a shorter time. Accordingly, throughput can be improved and the film quality of the substrate to be processed in plasma processing can be improved.

In detail, for example, a table showing a relationship between a gas flow rate, a second pressure to be set in a next process, and an opening degree of the pressure control valve plate is stored in a memory unit, such as a hard disk (not shown) or the like, of a control unit provided in the plasma processing apparatus. When a pressure is changed from the first pressure, which is a current pressure in the processing container, to the second pressure, an opening degree of the pressure control valve plate is changed to the opening degree shown in the table.

TABLE 1

| | | Second Pressure (Torr) | | | | | | | | | |
|---|---|---|---|---|---|---|---|---|---|---|---|
| | | 0.050 | 0.100 | 0.150 | 0.200 | 0.300 | 0.500 | 1 | 2 | 5 | 10 |
| Opening Degree Of Valve Plate (%) | 2 | | | | | | | | a | d | h | l |
| | 4 | | | | | | | a | d | n | j | o |
| | 6 | | | | | | a | b | e | j | l | r |
| | 8 | | | | a | b | c | f | k | m | s |
| | 10 | | | a | b | c | d | g | n | q | |
| | 12 | | a | b | c | f | f | h | l | r | |
| | 15 | a | b | d | d | i | h | j | o | | |
| | 20 | d | d | h | h | j | l | o | | | |
| | 30 | h | k | l | l | p | p | | | | |
| | 50 | l | n | o | o | r | | | | | |

In detail, Table 1 will be explained. Table 1 shows a relationship between a second pressure, and an opening degree of a valve plate with respect to a gas flow rate. The opening degree of the valve plate was set in a range of, for example, 2% to 50%, and the second pressure was set in a range of 0.050 Torr (50 mTorr) to 10 Torr. Here, 'a' through 's' in Table 1 indicate gas flow rates, and the same alphabet indicates the same gas flow rate. That is, if a gas flow rate is 'a' and a second pressure to be set in a next process is 1 Torr, an opening degree of a valve plate is 2%, and if a gas flow rate is 'a' and a second pressure to be set in a next process is 0.500 Torr, an opening degree of a valve plate is 4%.

Also, in a case that is not stored in the table, a value calculated based on data in the table may be used.

Now, improved film quality will be additionally explained. When film formation in plasma processing is started, the film formation is performed by gradually stacking a reaction product on the substrate to be processed by using CVD or the like. In this case, when the film formation is started, a so-called interface with a film on a lower layer side is formed and thus better film quality is required. Here, if a time required to make a pressure constant is short, an interface can be formed under precise pressure control. Accordingly, an interface with better quality can be formed, thereby improving film formation of the substrate to be processed.

Figure 15:
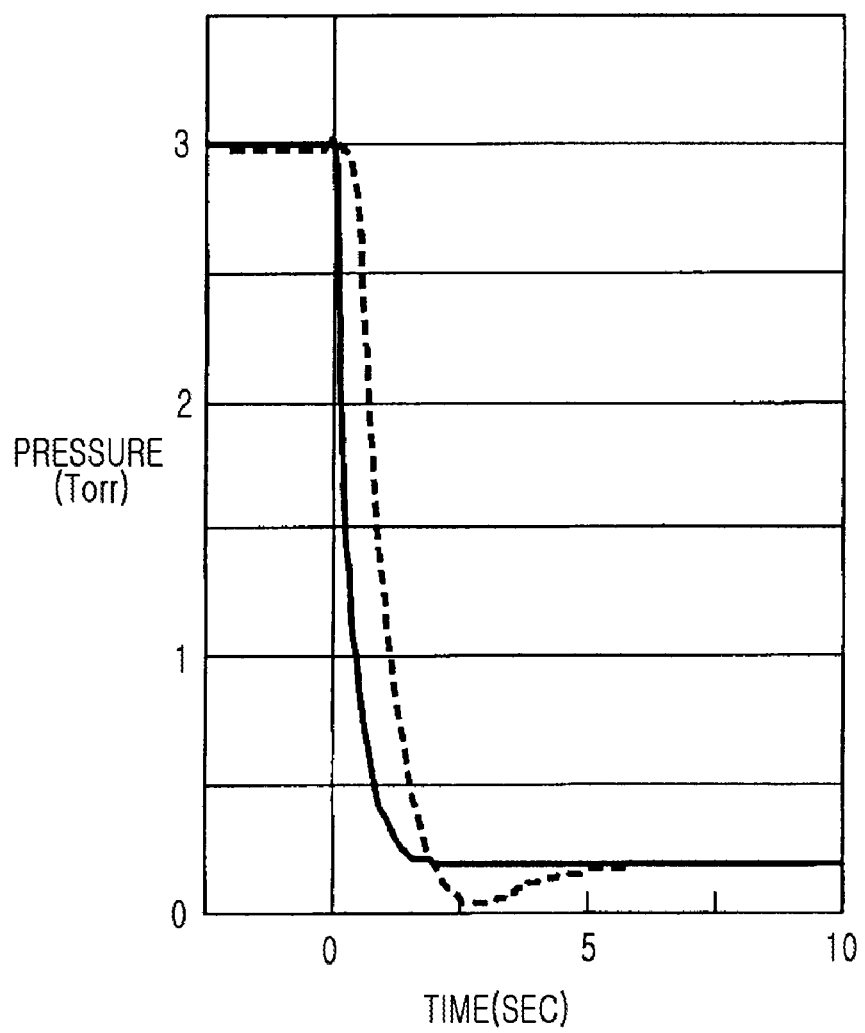
FIG. 15 is a graph showing a relationship between a pressure in a processing container and an elapsed time when a pressure is controlled.
Figure 16:
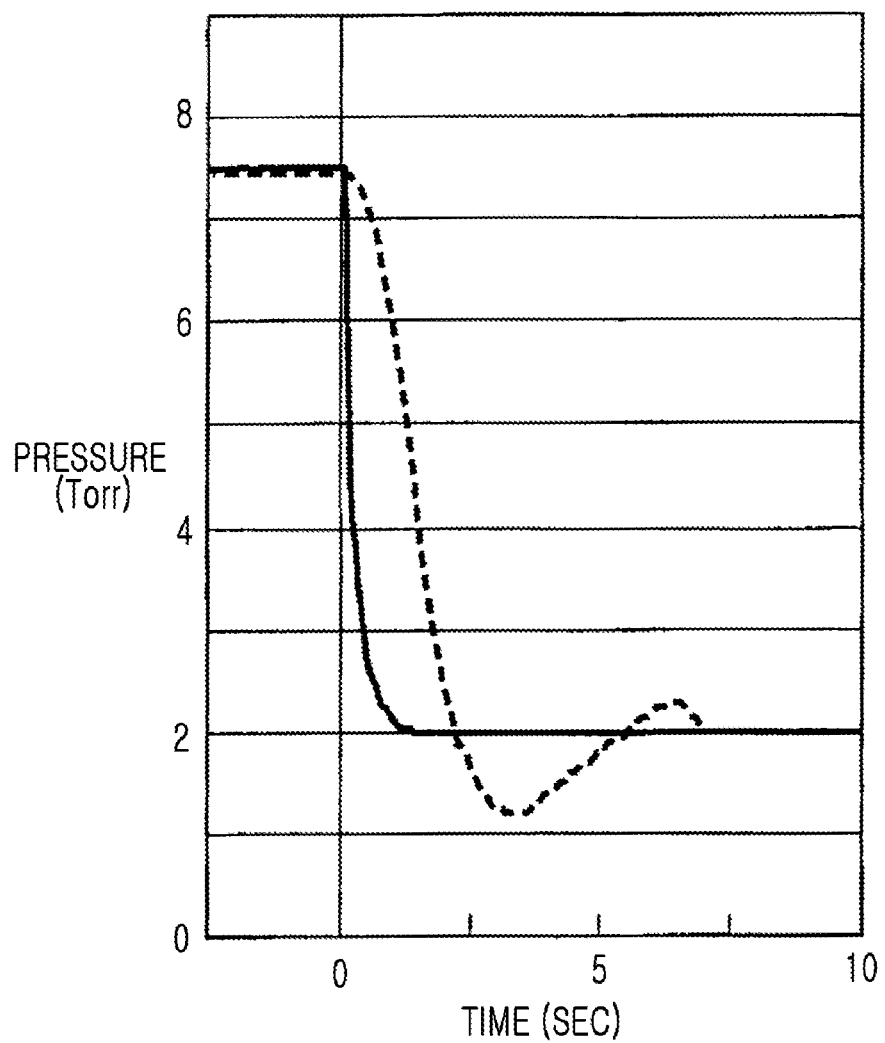
FIG. 16 is a graph showing a relationship between a pressure in a processing container and an elapsed time when the pressure is controlled.

FIGS. 15 and 16 are graphs showing a relationship between a pressure in the processing container and an elapsed time when a pressure is controlled in the plasma processing apparatus configured as described above. A horizontal axis represents an elapsed time (sec) and a vertical axis represents a pressure (Torr). FIG. 15 shows a case where a pressure is decreased from 3 Torr to 0.2 Torr, and FIG. 16 shows a case where a pressure is decreased from 7.5 Torr to 2 Torr. Also, an argon (Ar) gas is used as the gas, and a gas flow rate is set to 150 sccm. A time when changing a pressure is set to 0 second, and film formation is performed after 5 seconds elapse.

Referring to FIGS. 15 and 16, a conventional method is indicated by a dotted line. That is, in FIG. 15, although a pressure reaches 0.2 Torr which is a desired pressure after about 2 seconds elapse, the pressure is decreased to a value lower than 0.2 Torr due to subsequent undershoot. After 5 seconds elapse, the pressure is stabilized to 0.2 Torr. In FIG. 16, although a pressure reaches 2 Torr which is a desired pressure after about 2.5 seconds elapse, undershoot and overshoot subsequently occur, and thus the pressure is stabilized to 2 Torr after 7 seconds elapse. Meanwhile, the case according to the present invention is indicated by a solid line. That is, in FIG. 15, a pressure reaches 0.2 Torr after about 2 seconds elapse, and in FIG. 16, a pressure reaches 2 Torr after about 2 seconds elapse. Afterward, undershoot or overshoot does not occur. That is, in the present invention, a pressure reaches a desired pressure and is stabilized faster. Accordingly, in plasma processing after depressurization, film quality of an interface which is required to have better quality even during film formation is better in the present invention than in the conventional method.

Figure 17:
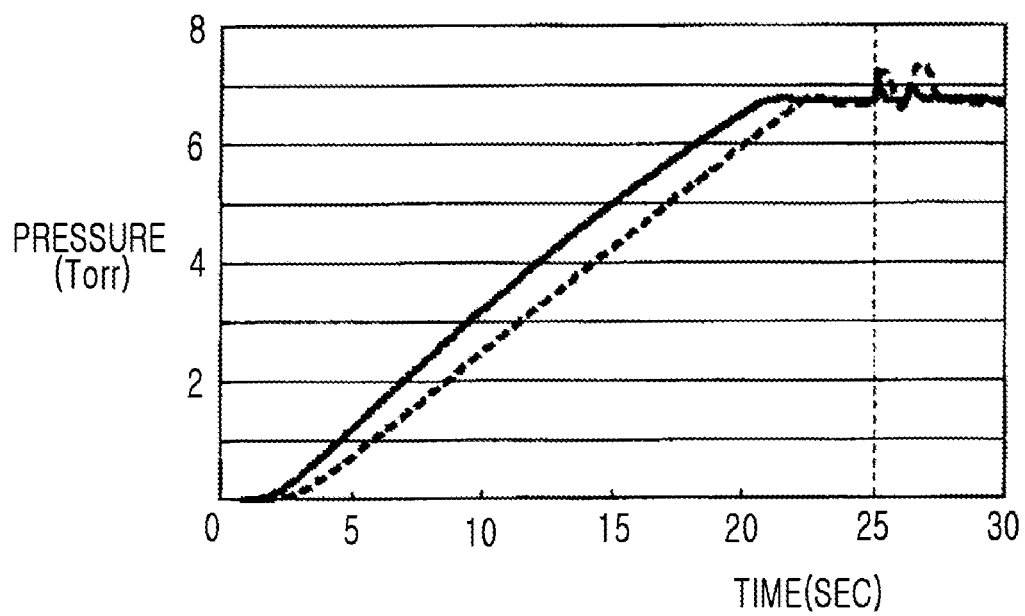
FIG. 17 is a graph showing a relationship between an elapsed time and a pressure when the pressure is increased to a predetermined pressure.

Also, as shown in FIG. 17, in order to increase a pressure from several mTorr to several Torr at one time, both a low pressure valve and a high pressure valve need to be used, in the conventional method indicated by a dotted line. Meanwhile, in the case according to the present invention indicated by a solid line, a pressure can be increased from several mTorr to several Torr at one time by using only one pressure control valve configured as described above. Accordingly, the apparatus can be made compact and operability can be greatly improved. Also, in a case where a pressure is greatly increased in such a short time, a gas supply is rate-determining, that is, a rate at which a gas is supplied is dominant. Even in this case, an effect of overshoot and undershoot is reduced, thereby changing a pressure to a desired pressure faster. Also, FIG. 17 is a view showing a relationship between an elapsed time (sec) and a pressure (Torr) while increasing a pressure.

Also, in the gas supply unit, a valve capable of opening and closing the gas supply path for supplying a gas into the processing container may be additionally provided in the gas supply path.

Figure 18:
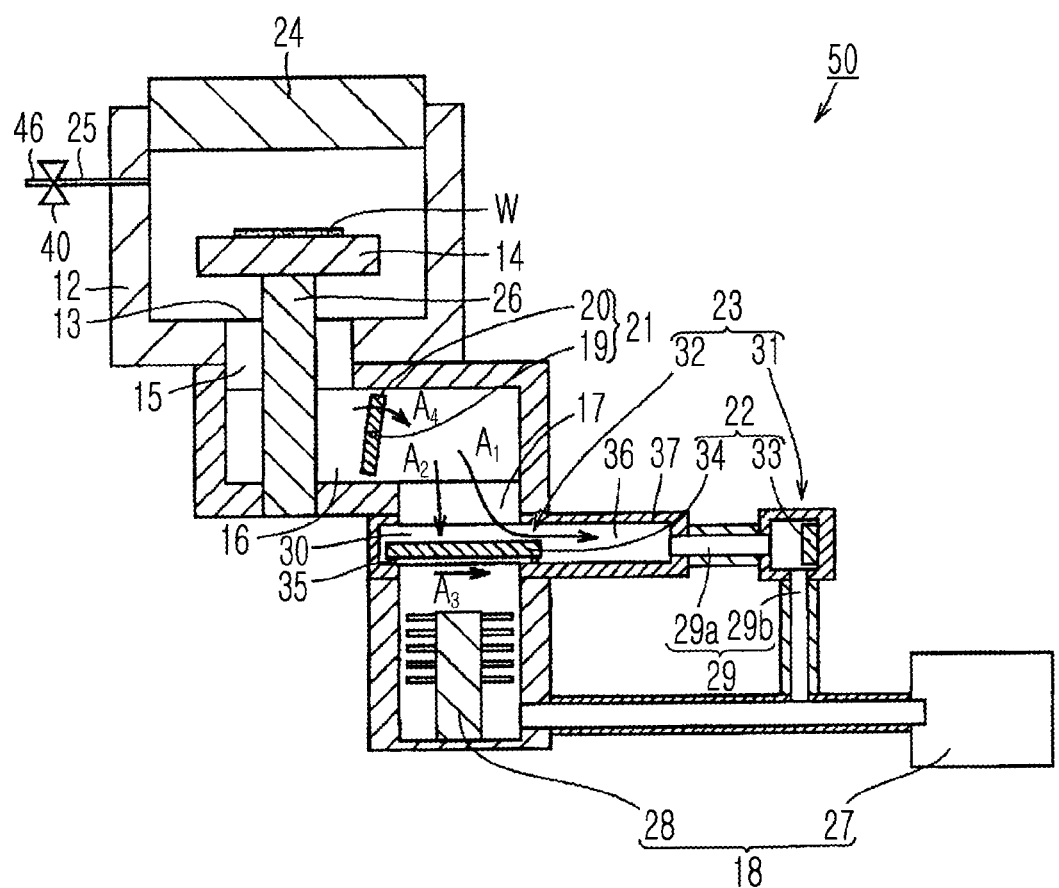
FIG. 18 is a schematic cross-sectional view showing main portions of a plasma processing apparatus according to another embodiment of the present invention.

FIG. 18 is a schematic cross-sectional view of a plasma processing apparatus in this case, corresponding to the cross-section of FIG. 1. Also, the same elements as those in the plasma processing apparatus 11 of FIG. 1 are denoted by the same reference numerals and an explanation thereof will not be given. Referring to FIG. 18, a plasma processing apparatus 50 includes a gas supply valve 40 which is provided at a position closer to the processing container 12 and is capable of opening and closing a gas supply unit 46.

Next, a plasma processing method according to another embodiment of the present invention will be explained with reference to the plasma processing apparatus 50 having this configuration. In detail, in the plasma processing method, plasma processing is performed by changing a pressure from a first pressure to a second pressure that is higher than the first pressure.

Referring to FIG. 18, in the plasma processing apparatus 50, when a pressure in the processing container 12 is changed from the first pressure to the second pressure that is higher than the first pressure, a gas is supplied into the gas supply path 46 after closing the gas supply valve 40. After a predetermined period of time elapses, the gas supply valve 40 is opened to supply a gas into the processing container 12.

That is, a plasma processing method according to the present invention is performed in a plasma processing apparatus, the plasma processing apparatus including: a holding stage on which a substrate to be processed is held; a processing container which has an exhaust hole for depressurization under the holding stage and accommodates the holding stage; a gas supply unit which includes a gas supply path for supplying a gas into the processing container and a gas supply valve capable of opening and closing the gas supply path and which supplies a gas into the processing container; a first exhaust path which extends downward from the exhaust hole; a second exhaust path which is connected to a downstream side of the first exhaust path in an exhausting direction and extends in a direction different from a direction in which the first exhaust path extends, and whose cross-section, which orthogonally intersects with the exhausting direction, is horizontally long such that a widthwise length is greater than a vertical length in the cross-section; a third exhaust path which is connected to a downstream side of the second exhaust path in the exhausting direction and extends in a direction different from the direction in which the second exhaust path extends; a pump which is connected to a downstream side of the third exhaust path in the exhausting direction and depressurizes an inside of the processing container; a pressure control valve which is provided in the second exhaust path, and includes a pressure control valve plate which is rotatable about a shaft extending in a longer direction of the pressure control valve plate, is capable of closing the second exhaust path and controls a pressure at upstream and downstream sides in the exhausting direction; a shut-off valve which is provided in the third exhaust path and includes a shut-off valve plate which opens and closes the third exhaust path; and a pressure changing unit which changes a pressure in the processing container from a first pressure to a second pressure that is different from the first pressure, the plasma processing method including: when the pressure in the processing container is changed from the first pressure to the second pressure, supplying a gas into the gas supply path while the gas supply valve is closed; and after a predetermined period of time elapses from the supplying of the gas, opening the gas supply valve to supply a gas into the processing container thereby controlling the pressure in the processing container to the second pressure.

As such, when a pressure in the processing container is changed from a first pressure to a second pressure, a pressure can be changed to a desired pressure in a shorter time by reducing a loss during increasing a pressure due to a gas exhausted from the exhaust hole 13. Accordingly, throughput can be additionally improved. In this case, in order to further reduce a required time, it is preferable to maximize a flow rate at which a gas is supplied when the gas supply valve 40 is closed. Also, a mechanism including the gas supply valve 40 and employing the aforesaid method during increasing a pressure is hereinafter referred to as a boost mechanism.

Figure 19:
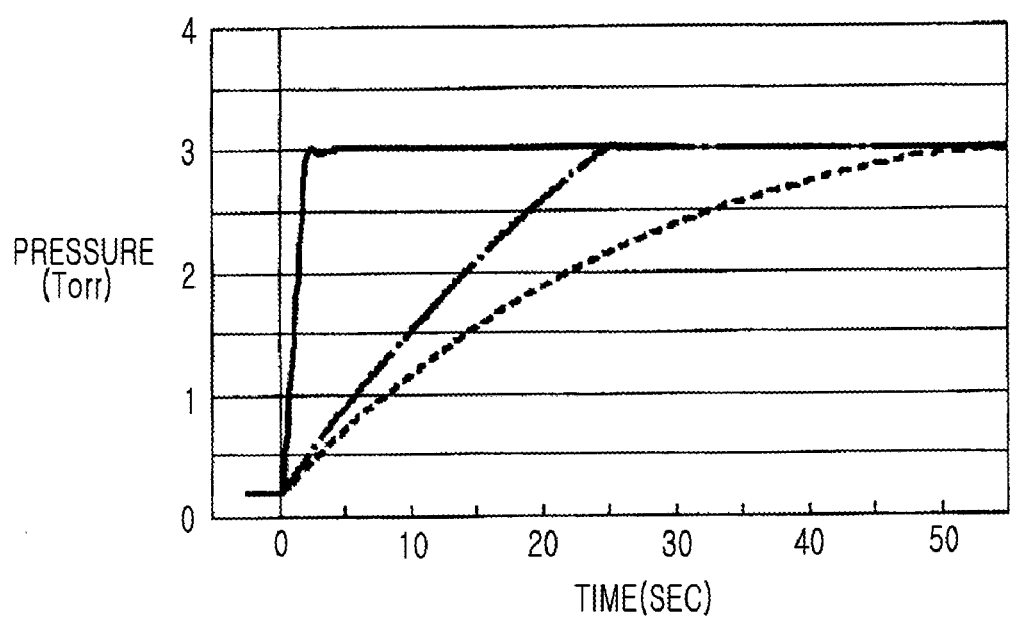
FIG. 19 is a graph showing a relationship between an elapsed time and a pressure when the pressure is increased to a predetermined pressure.

FIG. 19 is a graph showing a relationship between an elapsed time and a pressure when a pressure is increased to a predetermined pressure, in a plasma processing apparatus including a boost mechanism, a plasma processing apparatus according to the present invention not including a boost mechanism, and a conventional plasma processing apparatus. Here, as to a boost condition in the plasma processing apparatus including the boost mechanism, a gas flow rate is 3500 sccm and an elapsed time is 2.5 seconds. Referring to FIG. 19, in the conventional plasma processing apparatus indicated by a dotted line, a time required to increase a pressure from several mTorr to 3 Torr is 50 seconds. However, in the plasma processing apparatus not including the boost mechanism indicated by a one-dot-dashed line, a required time is 25 seconds which is half of 50 seconds. Also, in the plasma processing apparatus including the boost mechanism indicated by a solid line, a pressure reaches a desired pressure in several seconds, specifically, about 2 seconds. As such, the plasma processing apparatus including the boost mechanism can have improved throughput.

Figure 20:
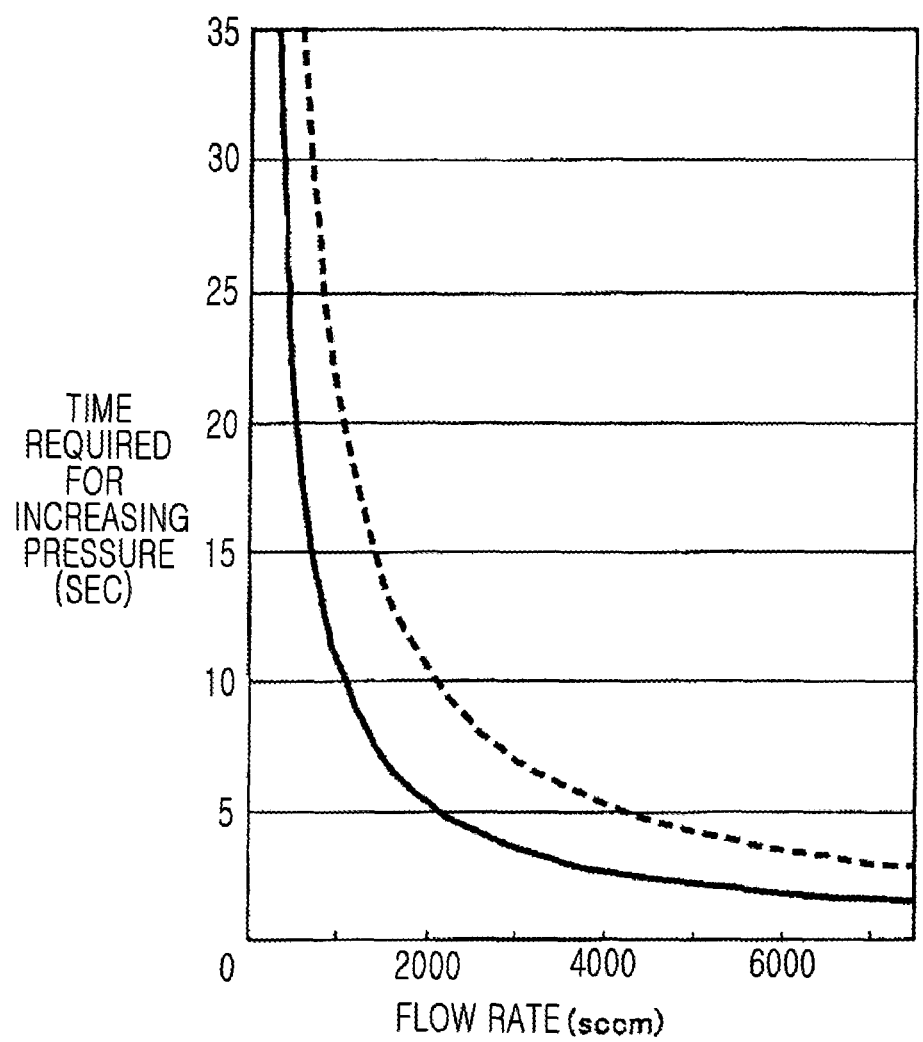
FIG. 20 is a graph showing a relationship between a time required to increase a pressure and a gas flow rate when a pressure is increased to a predetermined pressure.

FIG. 20 is a graph showing a relationship between a time required to increase a pressure and a gas flow rate when a pressure is increased to a predetermined pressure in a plasma processing apparatus including a boost mechanism. In FIG. 20, a vertical axis represents a time required to increase a pressure (sec), and a horizontal axis represents a gas flow rate (sccm). Also, in FIG. 20, a graph indicated by a solid line shows a case where a pressure is increased from 0.2 Torr to 3 Torr, and a graph indicated by a dotted line shows a case where a pressure is increased from 2 Torr to 7.5 Torr. Referring to FIG. 20, in any of the cases indicated by the solid line and the dotted line, a time required to increase a pressure is reduced drastically.

Table 2 and Table 3 below show a measured value and a calculated value of a time required to change a pressure from a first pressure to a second pressure by using a boost mechanism. Table 2 shows the measured value, and Table 3 shows the calculated value. In Table 2 and Table 3, a first pressure in a left column indicates a pressure in a processing container at a current time, that is, before pressure rise, and a second pressure in an uppermost row indicates a desired pressure, that is, a pressure in the processing container after pressure rise required for a process. Also, values other than pressures in Table 2 and Table 3 indicate required times (sec). Also, in Table 2 and Table 3, a gas flow rate is 61 (liters)/minute.

TABLE 2

|  |  | Second pressure (mTorr) | | |
|---|---|---|---|---|
|  |  | 1000 | 2000 | 3000 |
| First pressure (mTorr) | 0 | 0.6 | 1 | 1.6 |
|  | 1000 |  | 0.5 | 1 |
|  | 2000 |  |  | 0.4 |

TABLE 3

|  |  | Second pressure (mTorr) | | |
|---|---|---|---|---|
|  |  | 1000 | 2000 | 3000 |
| First pressure (mTorr) | 0 | 0.5 | 1 | 1.5 |
|  | 1000 |  | 0.5 | 1 |
|  | 2000 |  |  | 0.5 |

Here, the calculated value is obtained by Equation expressed by required time=pressure difference×volume (l) of processing container/gas flow rate (slm).

Referring to Table 2 and Table 3, it is found that an actual time required to increase a pressure by using a boost mechanism is almost the same as a calculated value based on theory.

Next, cleaning of a plasma processing apparatus will be explained. Deposition generated in a processing container is attached to a wall of an exhaust path or the processing container included in the plasma processing apparatus. The deposition attached to the wall of the exhaust path or the processing container needs to be removed by cleaning.

A method for cleaning a plasma processing apparatus according to the present invention is a method for cleaning the plasma processing apparatus configured as described above, that is, the plasma processing apparatus for performing plasma processing on a substrate to be processed, the plasma processing apparatus including: a holding stage on which the substrate to be processed is held; a processing container which has an exhaust hole for depressurization under the holding stage and accommodates the holding stage; a first exhaust path which extends downward from the exhaust hole; a second exhaust path which is connected to a downstream side of the first exhaust path in an exhausting direction and extends in a direction different from a direction in which the first exhaust path extends, and whose cross-section, which orthogonally intersects with the exhausting direction, is horizontally long such that a widthwise length is greater than a vertical length in the cross-section; a third exhaust path which is connected to a downstream side of the second exhaust path in the exhausting direction and extends in a direction different from the direction in which the second exhaust path extends; a pump which is connected to a downstream side of the third exhaust path in the exhausting direction and depressurizes an inside of the processing container; a pressure control valve which is provided in the second exhaust path, and includes a pressure control valve plate which is capable of closing the second exhaust path and controls a pressure at upstream and downstream sides in the exhausting direction; and a shut-off valve which is provided in the third exhaust path and includes a shut-off valve plate which opens and closes the third exhaust path.

Here, the method for cleaning the plasma processing apparatus includes: controlling a pressure in the plasma processing apparatus to a first pressure by using the pressure control valve; after the controlling of the pressure to the first pressure, first cleaning of cleaning the inside of the plasma processing apparatus by introducing a cleaning gas into the plasma processing apparatus; after the first cleaning, controlling the pressure in the plasma processing apparatus to a second pressure, which is higher than the first pressure, by using the pressure control valve; and after the controlling of the pressure to the second pressure, second cleaning of cleaning the inside of the plasma processing apparatus by introducing a cleaning gas into the plasma processing apparatus.

According to such a method for cleaning the plasma processing apparatus, in the plasma processing apparatus configured as described above, deposition attached to the wall of the exhaust path or the processing container can be removed actively by controlling a pressure in the plasma processing apparatus to a first pressure that is relatively low and increasing energy of the introduced cleaning gas. Also, after the deposition is removed actively in a low pressure state, deposition attached to the wall of the exhaust path or the processing container can be removed without damaging the wall by controlling the pressure to a second pressure that is relatively high and reducing energy of the introduced cleaning gas. In this case, due to the pressure control valve configured as described above, an inside of the plasma processing apparatus can be easily controlled from a low pressure state, in which the pressure in the plasma processing apparatus is the first pressure, to a high pressure state, in which the pressure in the plasma processing apparatus is the second pressure, while using the same exhaust line, that is, without switching between a high pressure exhaust line and a low pressure exhaust line. Accordingly, since cleaning processes at a low pressure and a high pressure are performed in the exhaust line where plasma processing is also performed, deposition can be efficiently removed, thereby reducing an entire cleaning time.

That is, in the first cleaning, first, an inside of the plasma processing apparatus is controlled to be in a low pressure state and a cleaning gas is plasmatized to obtain an ionized high-energy gas. Since such a high-energy gas has high energy even though a small number of gas particles exist in the plasma processing apparatus at the low pressure state, the high-energy gas can remove deposition actively; specifically, the high-energy gas can remove even a film of deposition firmly stuck to a wall constituting the exhaust path or the processing container. Next, in the second cleaning, the inside of the plasma processing apparatus is controlled to be in a high pressure state, and a cleaning gas is controlled to be in a radicalized low-energy state. Such a low-energy gas can remove deposition without damaging a wall of the exhaust path or the processing container. In this case, since a great number of gas particles exist in the plasma processing apparatus at the high pressure state, deposition can be appropriately removed. Due to these cleaning processes, damage to the wall of the exhaust path or the processing container can be reduced, thereby performing efficient cleaning. Such cleaning can be performed by the pressure control valve configured as described above. That is, since pressure control can be achieved in a wide range from a low pressure to a high pressure, a desired low pressure state and a desired high pressure state can be achieved by using the pressure control valve, thereby performing the aforesaid cleaning.

In this case, in a low pressure state, cleaning can be performed while processing the substrate to be processed in the processing container. Accordingly, a time for cleaning can be reduced and efficient cleaning can be performed.

Also, in the above embodiment, a protective seal member as a protective member for protecting the O-ring 35 from radicals may be disposed outside the O-ring provided on the low pressure shut-off valve 32.

Figure 21:
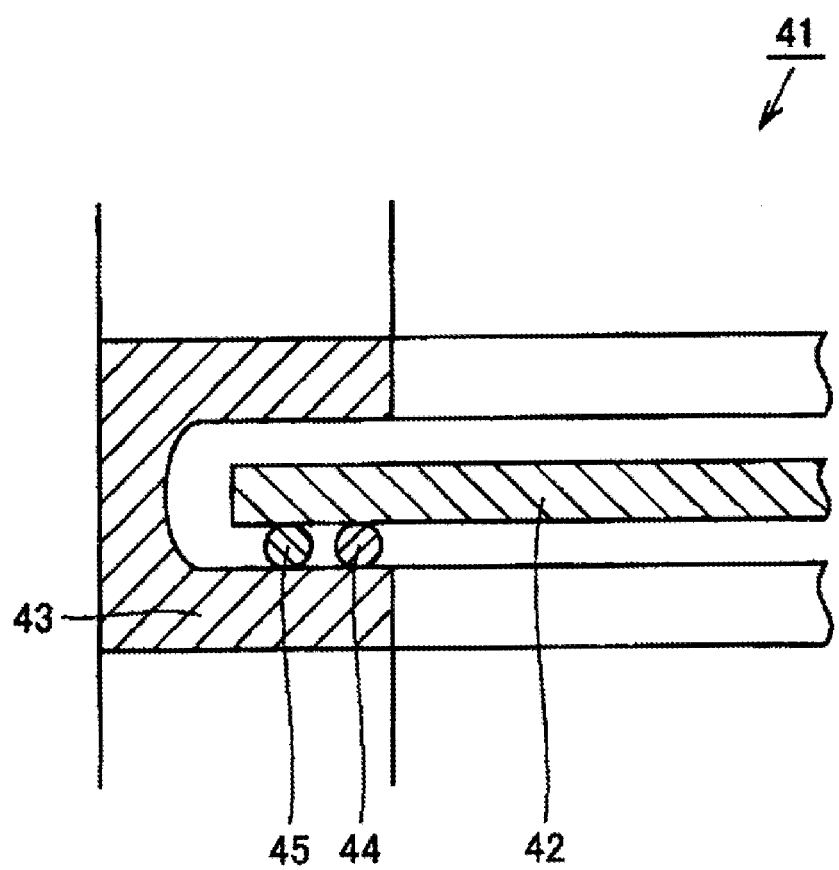
FIG. 21 is an enlarged cross-sectional view showing a part of a plasma processing apparatus according to yet another embodiment of the present invention.

FIG. 21 is an enlarged view showing a region around the low pressure shut-off valve 32 of the plasma processing apparatus in this case, corresponding to a portion XXI of FIG. 1. Referring to FIG. 21, an O-ring 44 and a protective seal member 45 as a protective member are provided under a low pressure shut-off valve plate 42 included in a plasma processing apparatus 41. Here, the O-ring 44 and the protective seal member 45 are disposed to be interposed between the low pressure shut-off valve plate 42 and a wall 43 constituting the exhaust path. The protective seal member 45 is provided outside the O-ring 44.

As such, the attack of generated radicals on the O-ring 44 can be reduced by the protective seal member 45. Accordingly, a lifetime of the O-ring 44 can be extended and maintenance can be improved.

Also, in the above embodiment, a heater may be provided under the O-ring. As such, the amount of attached deposition can be further reduced. In this case, by using a heat-resistant O-ring, a fatigue of the O-ring due to heat can be reduced.

Figure 22:
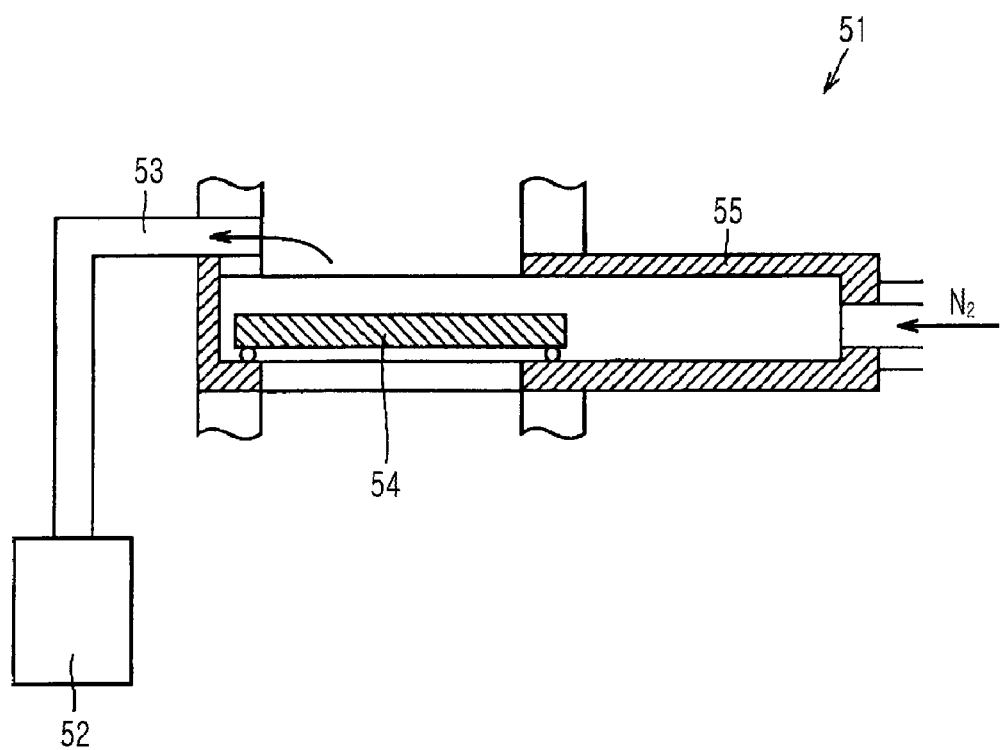
FIG. 22 is an enlarged cross-sectional view showing a part of a plasma processing apparatus according to yet another embodiment of the present invention.
Figure 23:
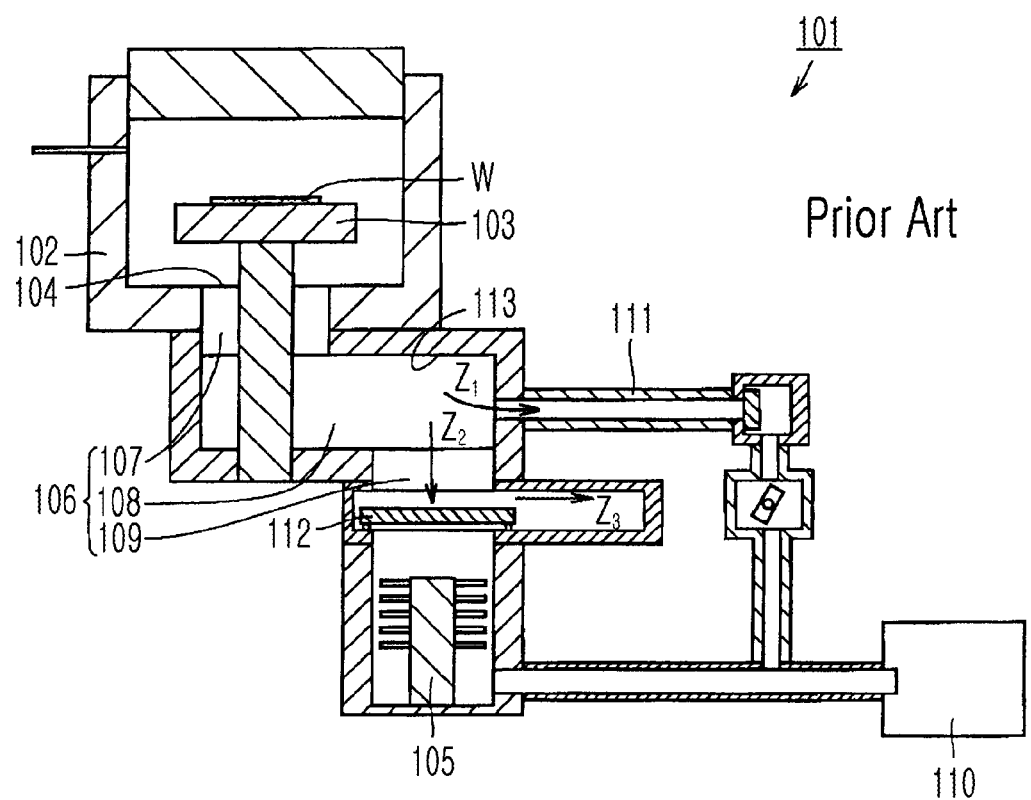
FIG. 23 is a schematic cross-sectional view showing main portions of a plasma processing apparatus including an APC.

Also, a pressure may be decreased from an atmospheric pressure to a predetermined pressure by using a high pressure dry pump, while introducing an $N_2$ gas or the like from an end side of the accommodating portion in the exhaust path. FIG. 22 is an enlarged cross-sectional view showing a part of the plasma processing apparatus in this case, corresponding to a portion XXII of FIG. 1. Referring to FIG. 22, in a plasma processing apparatus 51, a pressure is decreased through an exhaust path 53 by using a dry pump 52, while introducing a $N_2$ gas from an accommodating portion 55 that accommodates a low pressure shut-off valve plate 54. As such, since a concentration of the $N_2$ gas is increased in the accommodating portion 55 during the depressurization, the amount of deposition attached to a wall of the accommodating portion 55 can be further reduced.

Also, in the above embodiment, although the second exhaust path has a horizontally long rectangular cross-section orthogonally intersecting with an exhausting direction such that a widthwise length is greater than a vertical length in the cross-section, and a contour shape of the pressure control valve plate is a rectangular shape capable of closing the second exhaust path, the present invention is not limited thereto and, for example, the second exhaust path may have a horizontally long oval cross-section orthogonally intersecting with an exhausting direction such that a widthwise length is greater than a vertical length in the cross-section, and a contour shape of the pressure control valve plate may be an oval shape capable of closing the second exhaust path.

Also, in the above embodiment, although the pressure control valve plate is configured to rotate about the shaft extending in a longer direction, the present invention is not limited thereto and the pressure control valve plate may be configured to rotate about a shaft extending in a shorter direction.

Also, in the above embodiment, although the first, second, and third exhaust paths are configured to extend in directions perpendicular to one another, the present invention is not limited thereto and the first, second, and third exhaust paths may be configured to extend in different directions. As such, the apparatus can get smaller. Also, the exhaust path may be bent in more multiple steps.

Also, a pressure control valve for plasma processing apparatus according to the present invention is a pressure control valve included in a plasma processing apparatus for performing plasma processing on a substrate to be processed, the plasma processing apparatus including: a holding stage on which the substrate to be processed is held; a processing container which has an exhaust hole for depressurization under the holding stage and accommodates the holding stage; an exhaust path which has a portion extending downward from the exhaust hole and whose cross-section, which orthogonally intersects with an exhausting direction, has a portion of a longer direction and a portion of a shorter direction in at least a part of the exhaust path, with the longer direction orthogonally intersecting with the shorter direction; a pump which is connected to a downstream side of the exhaust path in an exhausting direction and depressurizes an inside of the processing container; and a shut-off valve which opens and closes the exhaust path. The pressure control valve may be configured to be provided in the exhaust path of an upstream side of the shut-off valve in the exhausting direction; include a pressure control valve plate which has a portion of a longer direction and a portion of a short direction, with the longer direction of the pressure control valve plate orthogonally intersecting with the shorter direction; and be attached to the part of the exhaust path, be capable of closing the exhaust path, and control a pressure at upstream and downstream sides of the pressure control valve for plasma processing apparatus in the exhausting direction. The at least one part of the exhaust path herein refers to the second exhaust path having a horizontally long cross-section shown in FIG. 3, and the longer direction refers to a horizontal direction.

As such, when a pressure in the processing container is changed from a first pressure to a second pressure, the pressure can be efficiently changed, thereby changing the pressure to a desired pressure in a shorter time. Accordingly, throughput can be improved and film quality of the substrate to be processed in plasma processing can be improved.

The pressure control valve for plasma processing apparatus may be applied not only to the plasma processing apparatus including the second exhaust path having a horizontally long cross-section as shown in FIG. 3 but also to a plasma processing apparatus including a second exhaust path having a vertically long cross-section, that is, having a cross-section obtained by rotating the second exhaust path of FIG. 3 by 90°. Also, although the pressure control valve plate is rotated about the shaft extending in a longer direction, the present invention is not limited thereto and, for example, the pressure control valve plate may be rotated about a shaft extending in a shorter direction.

Also, for device configuration, if needed, the pressure control valve for plasma processing apparatus may be disposed in the first exhaust path or the third exhaust path, and a plurality of the pressure control valves for plasma processing apparatus may be provided. Also, it is preferable that the shut-off valve is provided at a downstream side of the pressure control valve for plasma processing apparatus in the exhausting direction; for example, the shut-off valve may be provided in the second exhaust path.

Also, in the above embodiment, although the plasma processing apparatus uses a microwave as a plasma source, the present invention is not limited thereto and the plasma processing apparatus may use ICP (Inductively-coupled Plasma) or ECR (Electron Cyclotron Resonance) plasma, parallel flat-type plasma, or the like as a plasma source.

While the present invention has been particularly shown and described with reference to exemplary embodiments thereof, the present invention is not limited thereto, and it will be understood by those skilled in the art that various changes in form and details may be made therein without departing from the spirit and scope of the invention as defined by the appended claims.

INDUSTRIAL APPLICABILITY

A plasma processing apparatus according to the present invention can be effectively used when the apparatus is required to get smaller and good maintenance is required.

Also, a method for cleaning a plasma processing apparatus according to the present invention can be effectively used when efficient cleaning is used.

Also, a plasma processing method according to the present invention can be effectively used when throughput is required to be improved and film quality of an interface is required to be improved.

Also, a pressure control valve for plasma processing apparatus according to the present invention can be effectively used when throughput is required to be improved and film quality of an interface is required to be improved.

The invention claimed is:

1. A pressure control valve for a plasma processing apparatus for performing plasma processing on a substrate, the plasma processing apparatus comprising:
   a processing container;
   a holding stage disposed inside the processing container and capable of holding the substrate thereon;
   a pump disposed outside the processing container;
   an exhaust hole formed under the holding stage in the processing container;
   an exhaust path extending from the exhaust hole to the pump, wherein the pump is configured to depressurize inside of the processing container and the exhausting path, wherein the exhaust path includes a horizontally linearly extended portion; and
   a shut-off valve disposed at an end portion of the exhausted path, the shut-off valve opening and closing the exhaust path,
   wherein the horizontally linearly extended portion of the exhaust path has a rectangular or an oval cross-section having a horizontal length longer than a vertical length;
   wherein the plasma processing apparatus further includes a pressure control valve disposed in the horizontally linearly extended portion of the exhaust path;
   wherein the pressure control valve is formed of a pressure control valve plate having substantially same shape and size as those of the cross-section and a shaft formed in the pressure control valve along the horizontal length of the cross-section, in such a manner that the pressure control valve plate rotates about the shaft to thereby control
   a pressure at upstream and downstream sides of the pressure control valve.

2. The pressure control valve for plasma processing apparatus of claim 1, wherein the exhaust path further comprises:
   a first exhaust path which extends downward from the exhaust hole to the horizontally linearly extended portion; and
   a third exhaust path which extends downward from the horizontally linearly extended portion to the pump.

3. The pressure control valve for plasma processing apparatus of claim 2, wherein the shut-off valve is provided in the third exhaust path.

4. The pressure control valve for plasma processing apparatus of claim 1, wherein the shaft is held at both sides.

5. The pressure control valve for plasma processing apparatus of claim 1, wherein the pressure control valve is detachably provided.

* * * * *